(12) United States Patent
Abe

(10) Patent No.: US 12,183,772 B2
(45) Date of Patent: Dec. 31, 2024

(54) LIGHT EMITTING DEVICE

(71) Applicant: NICHIA CORPORATION, Anan (JP)

(72) Inventor: Koji Abe, Tokushima (JP)

(73) Assignee: NICHIA CORPORATION, Anan (JP)

( * ) Notice: Subject to any disclaimer, the term of this patent is extended or adjusted under 35 U.S.C. 154(b) by 421 days.

(21) Appl. No.: 17/828,490

(22) Filed: May 31, 2022

(65) Prior Publication Data

US 2022/0384519 A1 Dec. 1, 2022

(30) Foreign Application Priority Data

May 31, 2021 (JP) .................................. 2021-091897
Dec. 6, 2021 (JP) .................................. 2021-197849

(51) Int. Cl.
| | | |
|---|---|---|
| H01L 27/15 | (2006.01) | |
| H01L 33/10 | (2010.01) | |
| H01L 33/50 | (2010.01) | |
| H01L 33/56 | (2010.01) | |
| H01L 33/62 | (2010.01) | |

(52) U.S. Cl.
CPC ............ *H01L 27/156* (2013.01); *H01L 33/10* (2013.01); *H01L 33/502* (2013.01); *H01L 33/56* (2013.01); *H01L 33/62* (2013.01)

(58) Field of Classification Search
CPC ............... H01L 25/0753; H01L 27/156; H01L 33/00–60
See application file for complete search history.

(56) References Cited

U.S. PATENT DOCUMENTS

| | | |
|---|---|---|
| 2014/0346548 A1 | 11/2014 | Beppu et al. |
| 2016/0225959 A1 | 8/2016 | Pan et al. |
| 2021/0151422 A1* | 5/2021 | Iguchi ................. H01L 33/0095 |
| 2022/0077358 A1 | 3/2022 | Obara et al. |

FOREIGN PATENT DOCUMENTS

| | | |
|---|---|---|
| JP | 2012-256848 A | 12/2012 |
| JP | 2014-072213 A | 4/2014 |
| JP | 2016-146480 A | 8/2016 |
| JP | 2017-212301 A | 11/2017 |
| JP | 2018-120959 A | 8/2018 |
| JP | 6793899 B | 12/2020 |
| JP | 2021-009898 A | 1/2021 |

* cited by examiner

*Primary Examiner* — John A Bodnar
(74) *Attorney, Agent, or Firm* — Foley & Lardner LLP

(57) ABSTRACT

A light emitting device includes: a light emitting element; a first substrate having an upper surface comprising an element placement region on which the light emitting element is disposed; a light-transmissive member with a sheet-like shape that covers the light emitting element, wherein an outer edge of a lower surface of the light-transmissive member contacts an outer side of the upper surface of the element placement region of the first substrate; and a first protrusion portion disposed along an outer edge of an upper surface of the light-transmissive member and extending across an upper surface of the first substrate and the upper surface of the light-transmissive member, wherein the first protrusion portion comprises a top portion located higher than an upper surface of the light emitting element.

13 Claims, 17 Drawing Sheets

LIGHT EMITTING DEVICE

CROSS-REFERENCE TO RELATED APPLICATION

This application claims priority to Japanese Patent Application No. 2021-091897 filed on May 31, 2021, and Japanese Patent Application No. 2021-197849 filed on Dec. 6, 2021, the disclosures of which are hereby incorporated by reference in their entireties.

BACKGROUND

The present disclosure relates to a light emitting device.

A known light emitting device including a plurality of light emitting elements is used as a light source for a vehicle or a light source for a projector. A light emitting device used as a light source has a configuration in which, for example, light is emitted from the light source to the outside via a lens. Such a known light emitting device has a configuration in which the plurality of light emitting elements are arrayed on a submount, the submount is mounted on a wiring board, and the submount and the wiring substrate are connected via a wire (see Japanese Patent Publication No. 2021-009898 No. and 2017-212301).

SUMMARY

An object of embodiments according to the present disclosure is to provide a light emitting device with better reliability.

A light emitting device according to an embodiment of the present disclosure includes: a light emitting element; a first substrate including an element placement region with an upper surface on which the light emitting element is placed; a light-transmissive member with a sheet-like shape that covers the light emitting element, wherein an outer edge of a lower surface of the light-transmissive member comes into contact with an outer side of the upper surface of the element placement region of the first substrate; and a first protrusion portion disposed along an outer edge of an upper surface of the light-transmissive member and extending across an upper surface of the first substrate and the upper surface of the light-transmissive member, wherein the first protrusion portion includes a top portion located higher than an upper surface of the light emitting element.

According to an embodiment of the present disclosure, a light emitting device with better reliability can be provided.

DETAILED DESCRIPTION

Figure 1:
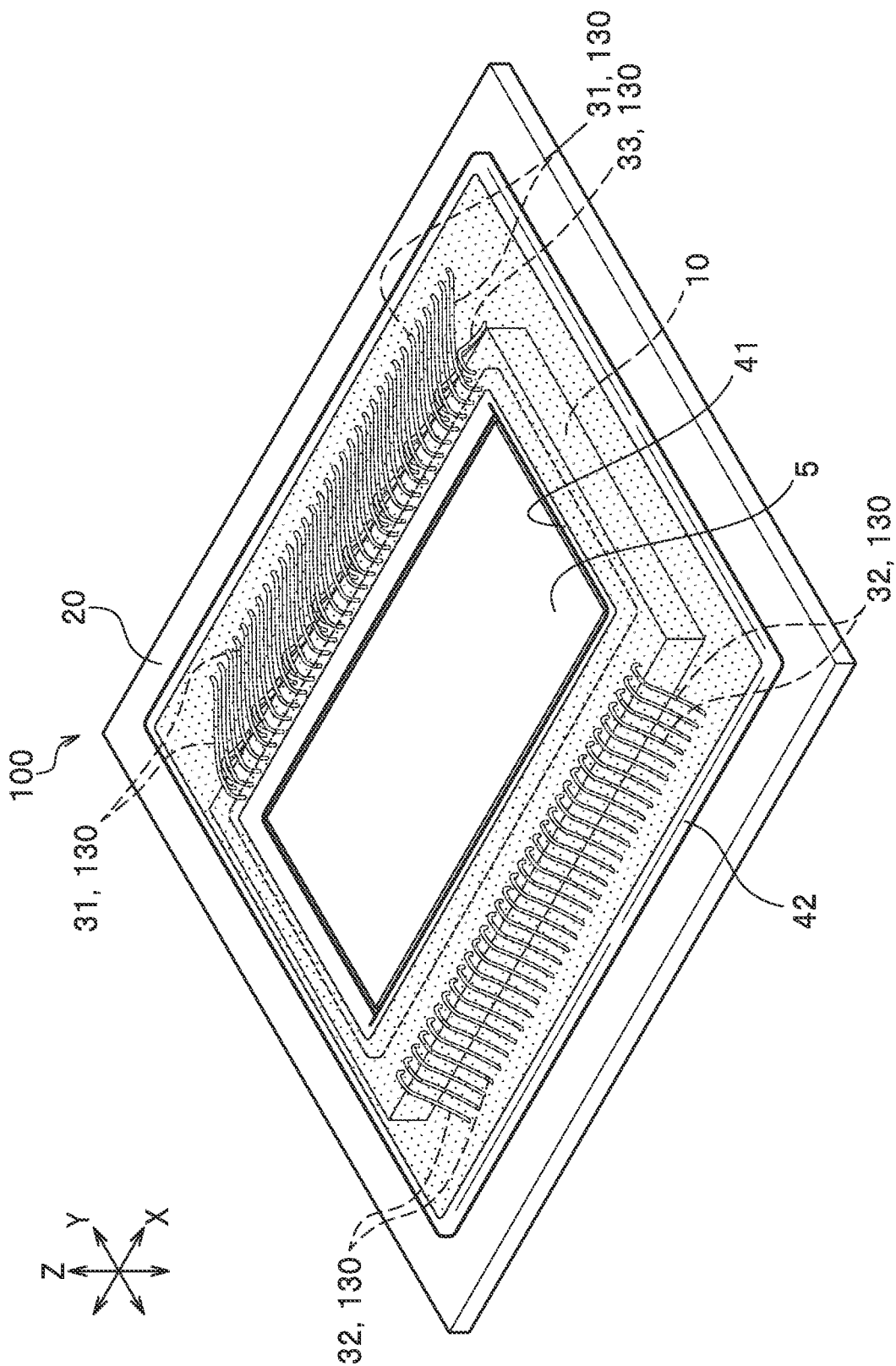
FIG. 1 is a schematic perspective view of a light emitting device according to a first embodiment.

Light emitting devices according to certain embodiments will be described below with reference to the drawings. Note that the size, positional relationship, or the like of members illustrated in the drawings may be exaggerated for clarity of description. In addition, the dimensions and placement positions of each member in a plan view and a corresponding cross-sectional view may not strictly match. In order to avoid excessive complication of the drawings, some elements are not illustrated, or an end view illustrating only a cut surface may be used as a cross-sectional view. Furthermore, in the following description, up, down, left, right, front, and back are relative terms and do not indicate absolute directions. Also, members having the same terms and reference characters basically represent the same members or members of the same or similar material, and the repeated detailed description thereof may be omitted as appropriate. Furthermore, in the embodiments, "covering" and "cover" imply not only a case with direct contact, but also imply a case with indirect contact, that is, covering with other members between, for example. In the present specification, a plan view corresponds to observing from a light extraction surface side of a light emitting device.

First Embodiment

Configuration of Light Emitting Device according to First Embodiment

The configuration of a light emitting device according to the first embodiment will be described with reference to FIGS. 1 to 7.

Figure 2:
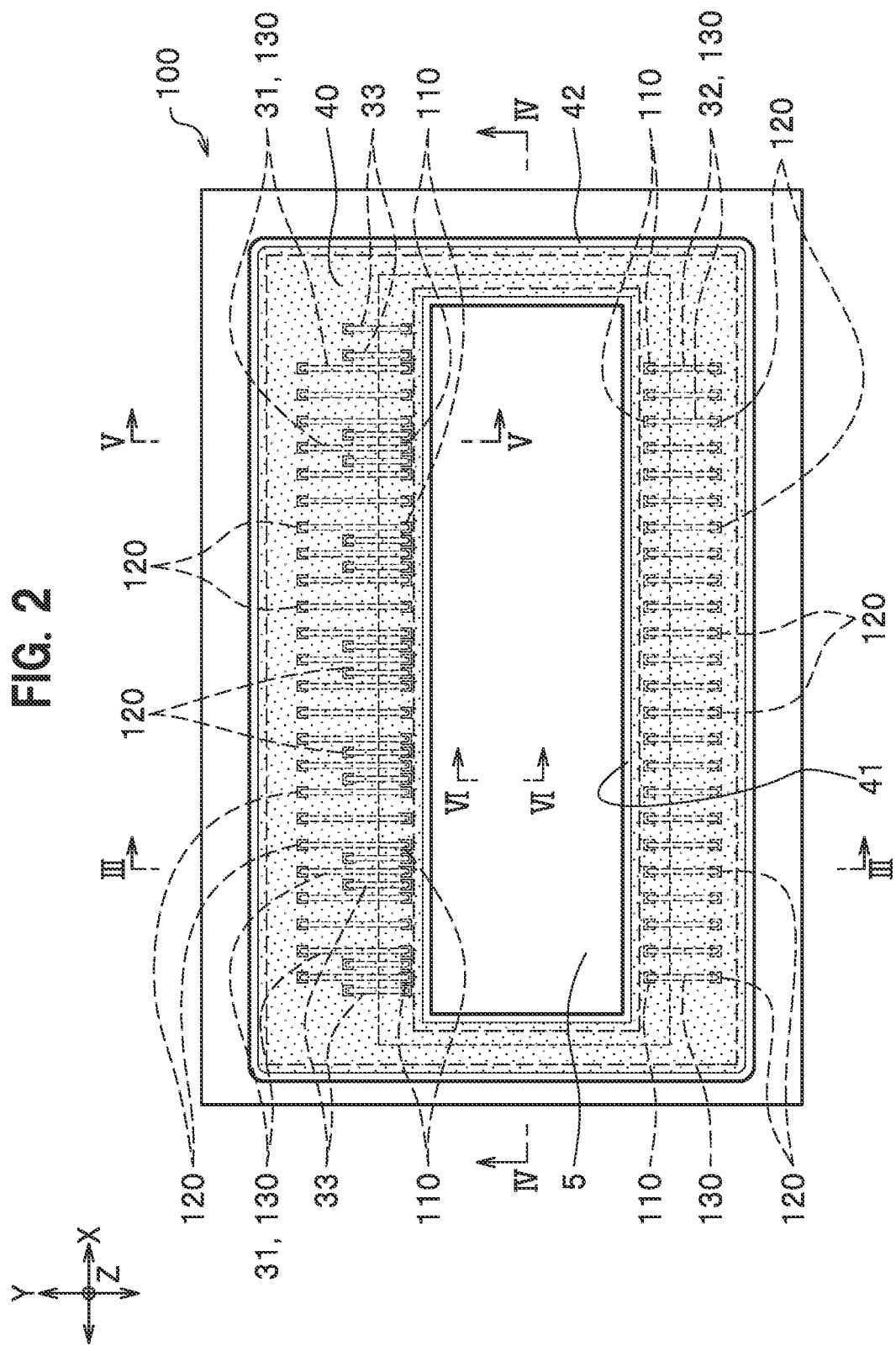
FIG. 2 is a schematic plan view of the light emitting device according to the first embodiment.
Figure 3:
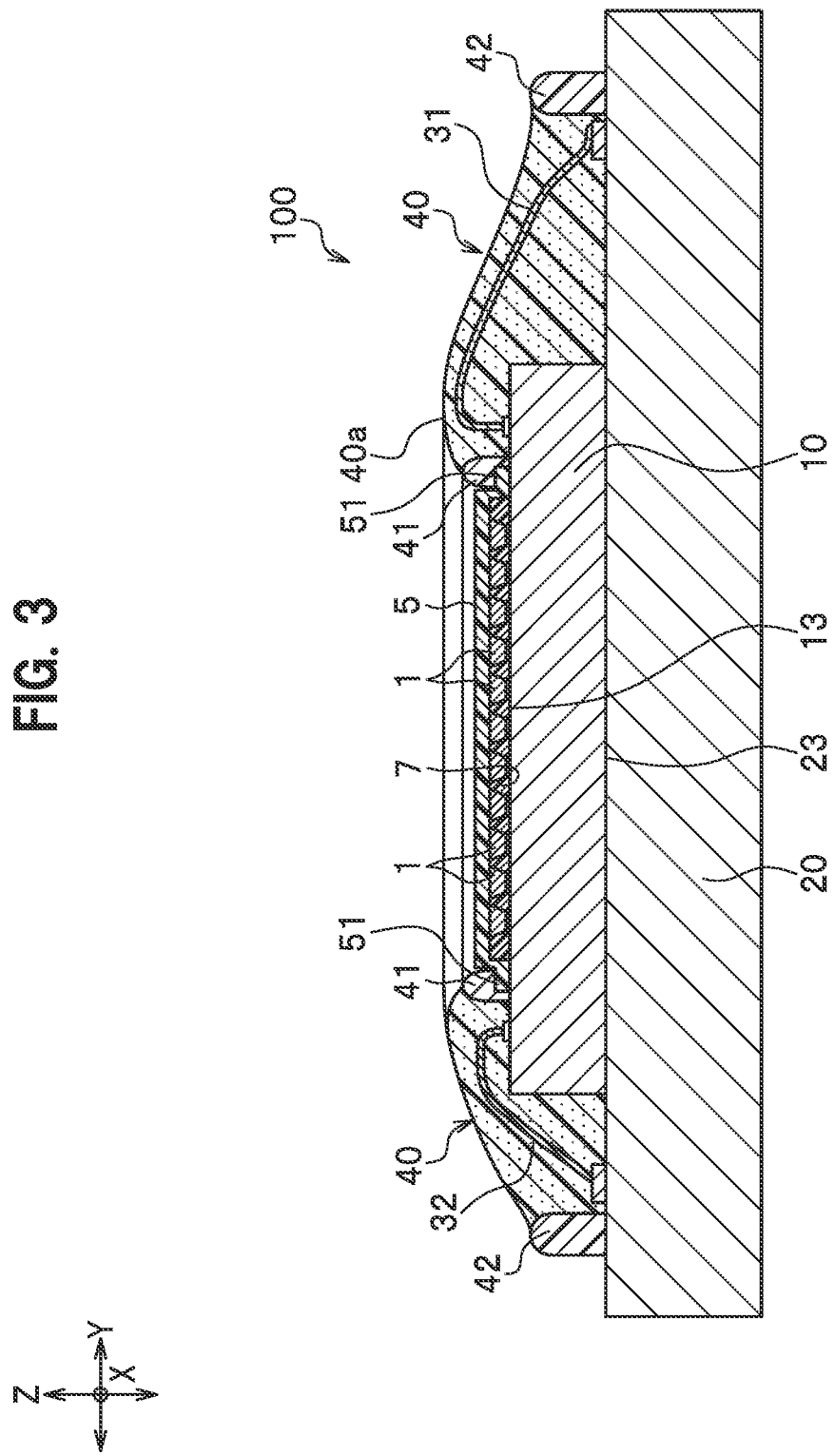
FIG. 3 is a cross-sectional view taken along line in FIG. 2.
Figure 4:
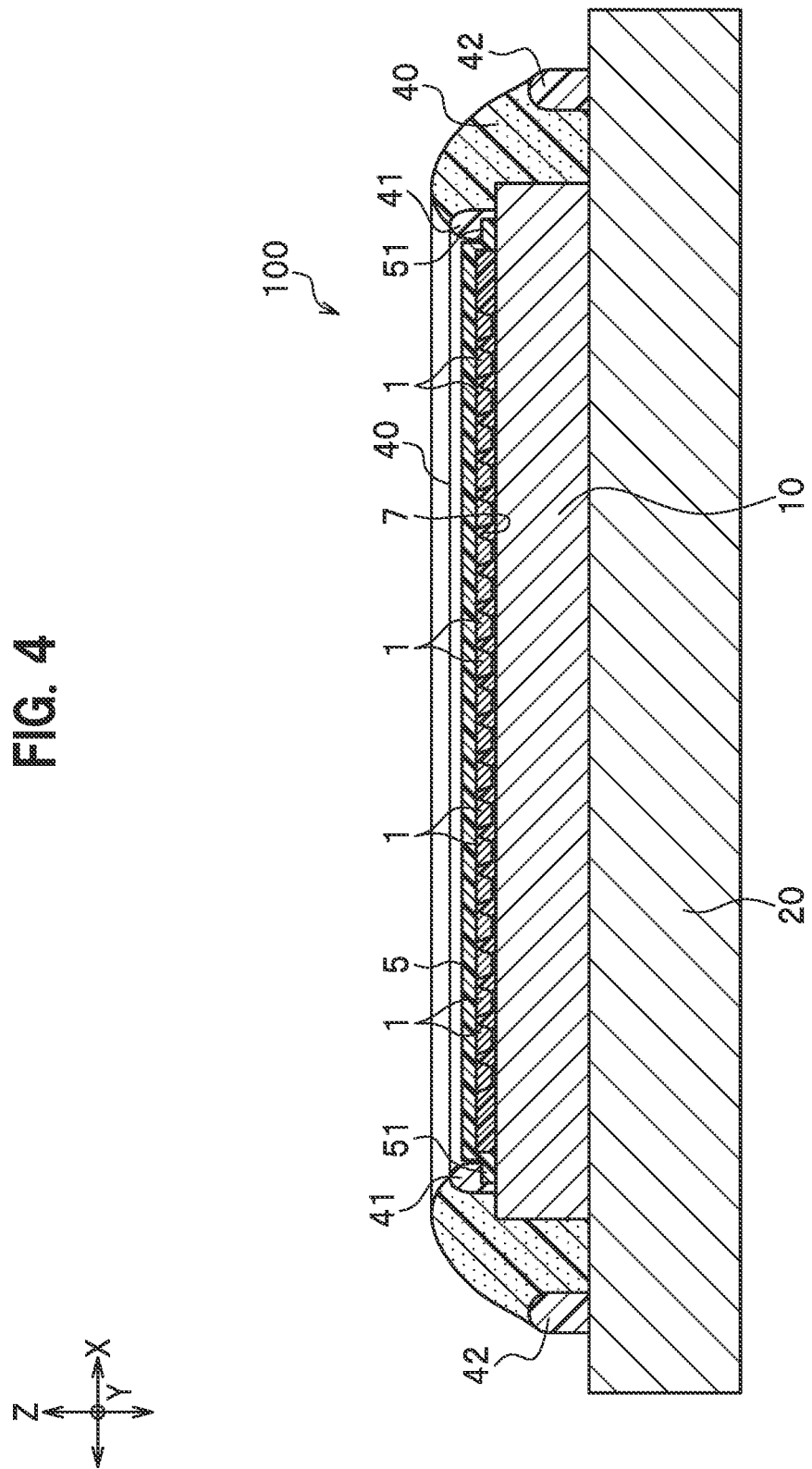
FIG. 4 is a cross-sectional view of a portion taken along line IV-IV in FIG. 2.
Figure 5:
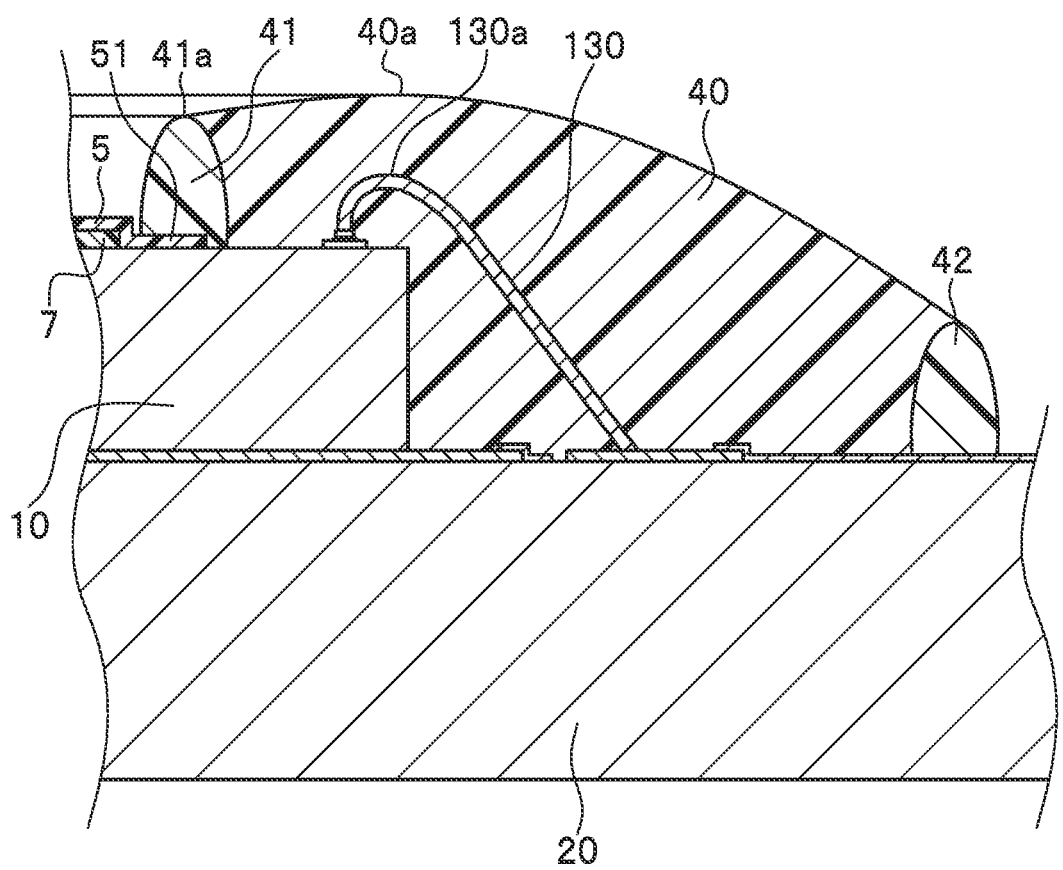
FIG. 5 is a cross-sectional view taken along line V-V in FIG. 2.
Figure 6:
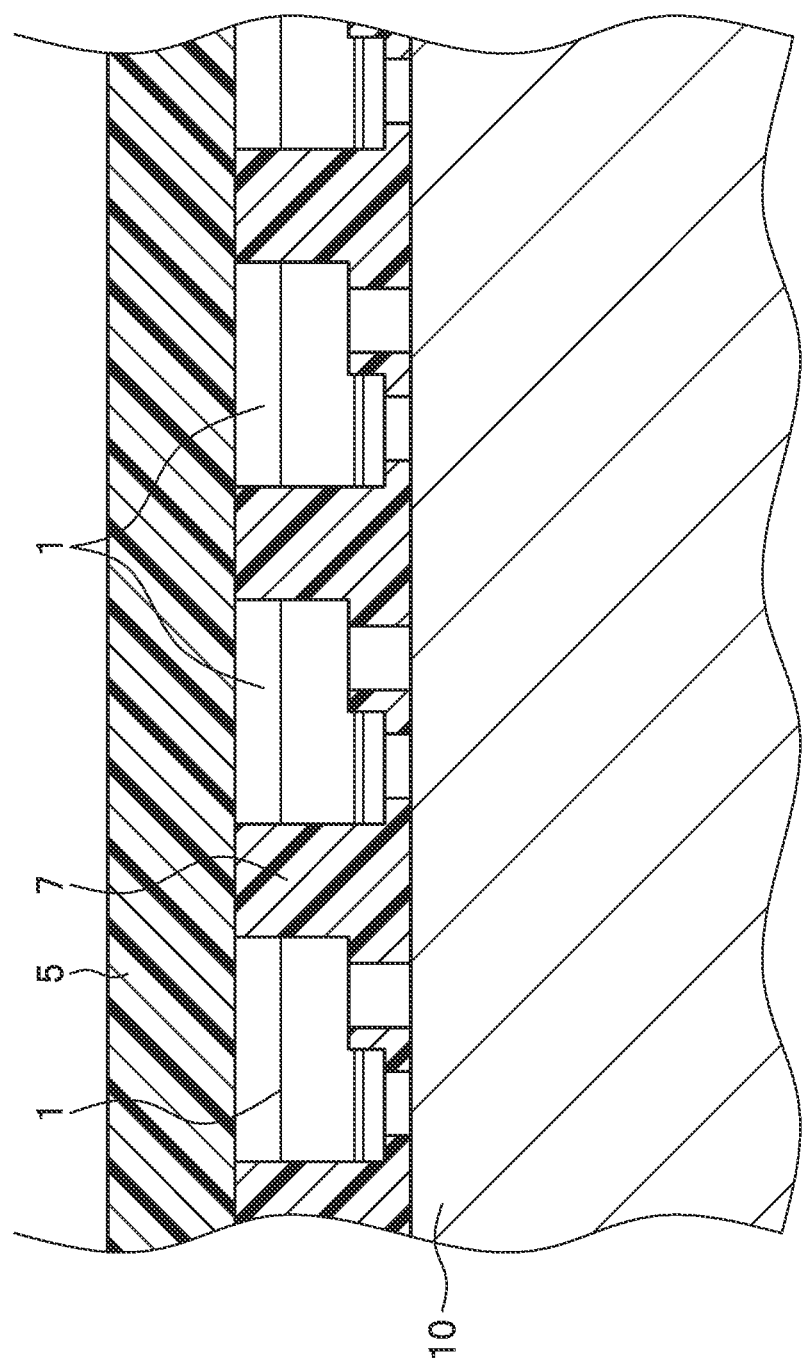
FIG. 6 is a cross-sectional view taken along line VI-VI in FIG. 2.
Figure 7:
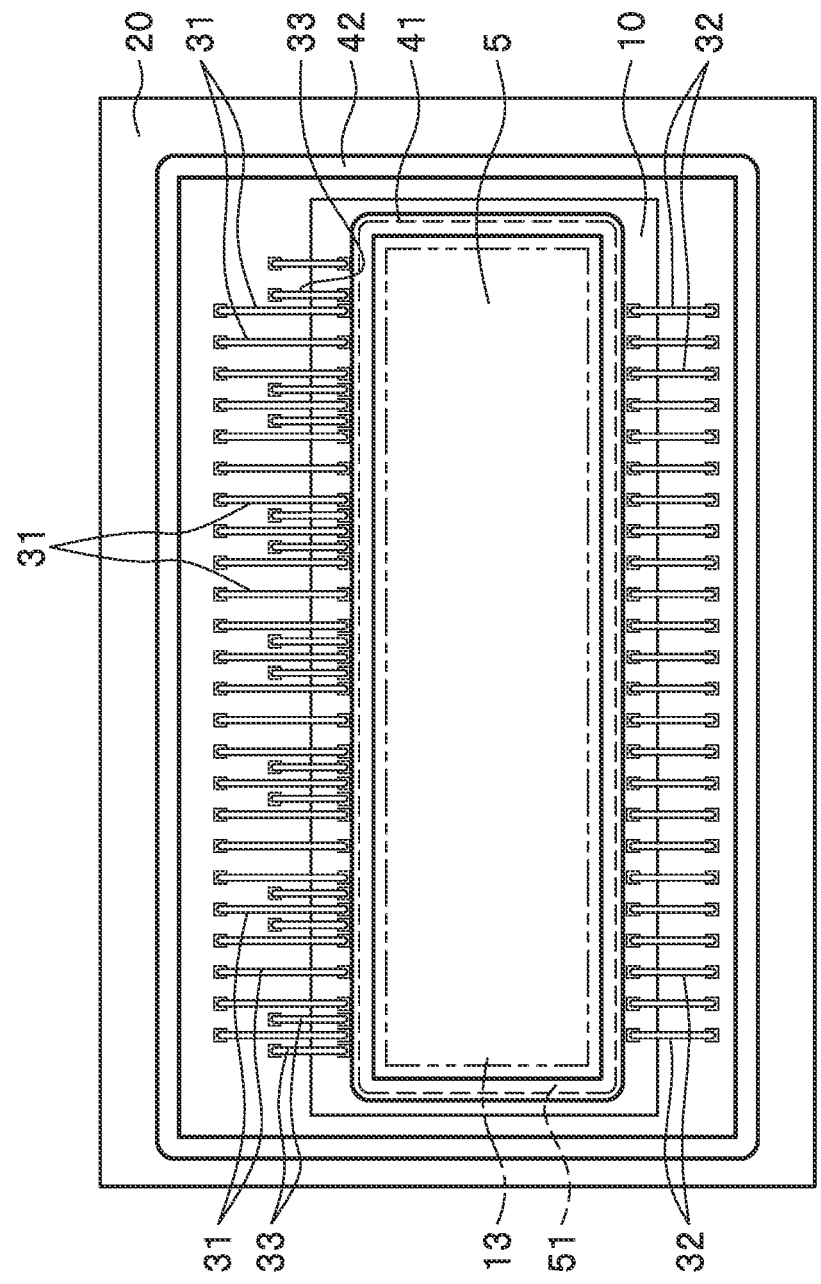
FIG. 7 is a schematic plan view of a first protrusion portion, a second protrusion portion, a light-transmissive member, and wires of the light emitting device according to the first embodiment.

FIG. 1 is an overall schematic perspective view of a light emitting device according to an embodiment. FIG. 2 is an overall schematic plan view of a light emitting device according to the first embodiment. FIG. 3 is a cross-sectional view taken along line III-III in FIG. 2. FIG. 4 is a cross-sectional view taken along line IV-IV in FIG. 2. FIG. 5 is a cross-sectional view taken along line V-V in FIG. 2. FIG. 6 is a cross-sectional view taken along line VI-VI in FIG. 2. FIG. 7 is a schematic plan view of a first protrusion portion, a second protrusion portion, a light-transmissive member, and wires of the light emitting device according to the first embodiment.

A light emitting device 100 includes a light emitting element 1; a first substrate 10 having an upper surface that includes an element placement region 13 where the light emitting element 1 is placed; a light-transmissive member 5 that covers the light emitting element 1, the outer edge of the lower surface coming into contact with the outer upper surface of the element placement region 13 of the first substrate 10; and a first protrusion portion 41 disposed along the outer edge of the upper surface of the light-transmissive member 5 and extending over the upper surface of the first substrate 10 and the upper surface of the light-transmissive member 5. The first protrusion portion 41 may be disposed in a single frame-like shape that continuously covers all of the outer edge of the upper surface of the light-transmissive member 5, or a plurality of the first protrusion portions may intermittently surround the outer edge of the upper surface of the light-transmissive member 5. In addition, the first protrusion portion 41 may be disposed in a frame-like shape with an interrupted portion. The first protrusion portion 41 is disposed in a rectangular frame-like shape surrounding the element placement region 13. The light emitting device 100 in this example includes a plurality of light emitting elements 1. Also, the plurality of light emitting elements 1 are aligned in rows in the element placement region 13.

Furthermore, the light emitting device 100 may include a second substrate 20 having an upper surface that includes a substrate placement region 23 where the first substrate 10 is placed; first terminals 110 disposed on the upper surface outward of the element placement region 13 of the first substrate 10; wires 130 that connects to second terminals 120 disposed on the upper surface outward of the substrate placement region 23 of the second substrate 20; and a covering member 40 that covers the wires 130. Here, the covering member 40 comes into contact with the first protrusion portion 41 and covers the upper surface of the first substrate 10 located outward of the first protrusion portion 41.

Note that the light emitting device 100 may include, in the element placement region 13 on the first substrate 10, the reflective members 7 that expose the upper surfaces of the light emitting elements 1 and cover the lateral surfaces. Furthermore, the light emitting device 100 may include a second protrusion portion 42 disposed on the upper surface of the second substrate 20 outward of the second terminals 120 and in contact with the covering member 40.

Configurations will be each described below.

First Substrate

The first substrate 10 includes a flat plate-like support member and a wiring disposed on the upper surface of the support member. The first substrate 10 includes the element placement region 13 where, on the upper surface, the plurality of light emitting elements 1 are placed. A wiring that connects to the light emitting element 1 is disposed in the element placement region 13. The first substrate 10 includes the plurality of first terminals 110 as wirings disposed on the upper surface outward of the element placement region 13. The first terminals 110 are electrically connected to the wiring disposed in the element placement region 13. The first substrate 10 is, for example, a silicon semiconductor substrate or the like, and a region where the wiring on the top surface is not disposed is covered with an insulating film. The wiring may also be disposed in the interior or on the lower surface of the support member. For example, an integrated circuit (IC) substrate with an integrated circuit for controlling driving of the plurality of light emitting elements 1 may be used for the first substrate 10.

The plurality of light emitting elements 1 are placed in a matrix in the element placement region 13. The element placement region 13 in plan view can be a rectangular region for example. The element placement region 13 is rectangular in this example, and the first terminals 110 are arranged in rows on the opposing long sides of this rectangular shape so as to sandwich the element placement region 13.

The first terminals 110 are, for example, power supply terminals of the first substrate and, in this example, are connected to a first end of the wires 130, and the first substrate 10 is electrically connected to the second substrate via the wires 130. In this example, the plurality of first terminals 110 are each substantially rectangular and disposed, on the upper surface of the first substrate 10, in rows along the long sides of the element placement region 13 separated from one another.

The plurality of light emitting elements 1 are arranged in a matrix on the first substrate 10 and are electrically connected to any one of the first terminals. The plurality of light emitting elements 1 may be connected in series or in parallel with the first terminal in groups of a predetermined number.

The wiring can be formed, for example, using a metal such as Cu, Ag, Au, Al, Pt, Ti, W, Pd, Fe, Ni, or the like or an alloy thereof. Such a wiring can be formed by electrolytic plating, non-electrolytic plating, vapor deposition, sputtering, or the like.

Second Substrate

The second substrate 20 includes a flat plate-like base body and a wiring disposed on at least the upper surface of the substrate. The second substrate 20 includes the substrate placement region 23 where, on the upper surface, the first substrate 10 is placed, and further includes the second terminals 120 on the upper surface located outward of the substrate placement region 23.

The substrate placement region 23 is a region where the first substrate 10 is placed. The substrate placement region 23 is set as a region having an area equal to the shape of the first substrate 10 in a plan view. Here, the meaning of equal encompasses tolerances caused by member tolerance and mounting tolerance in a acceptable range. When the first substrate 10 is rectangular in a plan view, the substrate placement region 23 may also be rectangular.

The second terminals 120 are located outward of the substrate placement region 23 and are arranged in rows on opposing long sides of the rectangular substrate placement region 23. The second terminals 120 are terminals connected to the second ends of the wires 130 that include the first ends connected to the first terminals 110. In this example, the second terminals 120 are each substantially rectangular and aligned, on the upper surface of the second substrate 20, in rows along the substrate placement region 23 separated from one another.

The second terminals 120 can be formed, for example, by a material and a forming method similar to that of the wiring of the first substrate 10 described above.

For the base body, a material having high heat dissipation is preferably used, and a material having a high light shielding property and base body strength is more preferably used. Specific examples include a ceramic such as alumina, aluminum nitride, mullite, and the like; a resin such as phenol resin, epoxy resin, polyimide resin, BT resin (bismaleimide triazine resin), polyphthalamide (PPA), and the like; a composite material formed from a resin and a metal or a ceramic; and the like. A flat plate-like base body may be used, and a base body with a cavity in the upper surface may be used. In this case, the substrate placement region of the second substrate 20 can be the bottom of the cavity, and the first substrate 10 can be placed inside the cavity.

The second substrate 20 may include a wiring for placing the first substrate 10 on the surface of the substrate placement region 23. The first substrate 10 and the second substrate 20 can be joined via a bonding material such as an Ag sintered body, solder, an adhesive resin, and the like.

Wire

Examples of the wire 130 include an electrical conductive wire containing a metal such as Au, Cu, Pt, Al and/or an alloy containing at least these metals. In particular, Au having good thermal resistance and the like is preferably used. The diameter of the wire is in a range, for example, from 15 μm to 50 μm. Note that in this example, the wire 130 includes a first wire 31, a second wire 32, and a third wire 33 with lengths from one another. The first wire 31, the second wire 32, and the third wire 33 can each be formed of a similar member.

The wire 130 may be disposed so as to extend across the long side of the substantially rectangular first substrate 10 in a plan view and, for example, run substantially orthogonal to the long side.

Light Emitting Element

For example, the light emitting element 1 has a substantially rectangular shape in a plan view and includes a semiconductor layered body and a positive and negative electrode disposed on the surface of the semiconductor layered body. The light emitting element 1 includes a positive and negative electrode on the same surface side and is mounted on the first substrate 10 with the surface provided with the electrodes as the lower surface and the lower surface facing the upper surface of the first substrate 10. In this case, the upper surface facing the surface where the electrodes are disposed is a main light extraction surface of the light emitting element 1. Note that in the light emitting device 100, the light emitting elements 1 are placed on the first substrate 10 and aligned in a row at predetermined intervals in the matrix direction. The size and number of the light emitting elements 1 used can be selected as appropriate depending on the form of the desired light emitting device. Of these, smaller light emitting elements 1 are preferably placed at a higher density. This allows the irradiation range to be controlled in a larger number of divisions and allows the light emitting elements 1 to be used as a light source of a high resolution illumination system. For example, 1000 to 20000 rectangular light emitting elements 1 having a single side in a range from 40 μm to 100 μm in a plan view may be placed in a matrix-like shape forming an overall rectangular shape.

For the light emitting elements 1, any wavelength can be selected. For example, a ZnS or nitride semiconductor ($In_XAl_YGa_{1-X-Y}N$, $0 \leq X$, $0 \leq Y$, $X+Y \leq 1$) and GaP can be selected to be used for the blue or green light emitting elements 1. For the red light emitting elements 1, a semiconductor represented by GaAlAs and AlInGaP can be suitably used. Furthermore, a semiconductor light emitting element made from other materials can be used. The composition and light emission color of the light emitting elements 1 used can be selected as appropriate in accordance with an intended purpose.

Bond Member

Note that, as illustrated in FIG. 6, the light emitting elements 1 are joined by an electrical conductive bond member on a wiring disposed in the element placement region 13 of the first substrate 10. In a case in which the light emitting elements 1 are flip chip mounted on the first substrate 10, a bump formed from a metal material such as Au, Ag, Cu, Al, and the like can be used as the bond member. Furthermore, a solder such as an AuSn-based alloy and an Sn-based lead-free solder may be used as the bond member. In this case, the light emitting elements 1 can be bonded to the first substrate 10 by a reflow method. In addition, an electrical conductive adhesive containing electrically conductive particles in the resin can be used as the bond member. The bond between the light emitting elements 1 and the first substrate 10 may be formed using a plating method. Examples of the plating material include Cu.

In addition, the bond between the light emitting elements 1 and the first substrate 10 may be formed by directly joining together the electrodes of the light emitting elements 1 and the wirings of the first substrate 10 without interposing the bond member.

Reflective Member

As illustrated in FIG. 6, the reflective members 7 are members that cover the upper surface of the first substrate 10 and the lateral surfaces of the light emitting elements 1. The upper surfaces of the light emitting elements 1 are exposed from the reflective members 7. The reflective members 7 may cover the space between the lower surfaces of the light emitting elements 1 and the first substrate 10. The reflective member 7 can reflect light emitted from the lateral surface of the light emitting element 1 and emit light from the upper surface of the light emitting surface of the light emitting device 100, i.e., the light-transmissive member 5. Thus, the light extraction efficiency of the light emitting device 100 can be improved. In addition, when the light emitting elements 1 are individually lit, the boundary between the light emitting area and the non-light-emitting area can be made clear. This improves the contrast ratio between the light emitting areas and the non-light-emitting areas. The reflective members 7 may be separated from the first protrusion portion 41 or may be disposed in contact with the first protrusion portion 41.

Note that for the reflective member 7, a soft resin having relatively low elasticity and good shape conformability is preferably used. Specifically, for the reflective member 7, a white resin containing particles of a light-reflective substance in a light-transmissive resin forming a base material is preferably used. Examples of the light-transmissive resin include a silicone resin, a modified silicone resin, an epoxy resin, a modified epoxy resin, an acrylic resin, and a resin such as a hybrid resin containing at least one type of these resins. Among these, a silicone resin having good heat resistance and light resistance is preferably used, and a dimethyl silicone resin is more preferably used. A dimethyl silicone resin has good reliability such as higher temperature resistance and the like, and thus can be suitably used as a material for vehicle-mounted applications. Examples of suitable light-reflective substances include titanium oxide, aluminum oxide, zinc oxide, barium carbonate, barium sulfate, boron nitride, aluminum nitride, glass filler, and the like. Note that the reflective member 7 may contain a light absorbing material such as a carbon black or graphite.

Light-Transmissive Member

The light-transmissive member 5 has light transmissivity and covers the upper surfaces of the plurality of light emitting elements 1. The light-transmissive member 5 collectively covers the upper surfaces of the plurality of light emitting elements 1 and the upper surfaces and lateral surfaces of the reflective members 7. The upper surface of the light-transmissive member 5 configures the light emitting surface of the light emitting device 100. The light-transmissive member 5 may include a light-transmissive resin that forms at least a base body and may include a wavelength conversion member in the base body. In this example, for example, the light-transmissive member 5 contains a wavelength conversion member, and at least a portion of the light emitted from the light emitting elements 1 is subject to wavelength conversion and then extracted to the outside.

The light-transmissive member 5 has substantially rectangular sheet-like shape in a plan view and includes the plurality of light emitting elements 1. An outer edge 51 of the lower surface of the light-transmissive member 5 is disposed in contact with the upper surface of the outer side of the element placement region 13 of the first substrate 10. For example, in the manufacturing process described below, the uncured light-transmissive member 5 formed in a sheet-like shape covers the light emitting elements 1 and the reflective members 7, and thereafter, the light-transmissive member 5 is softened by heating or the like and shaped along the reflective member 7 so that the outer edge of the lower surface of the light-transmissive member 5 comes into contact with the upper surface of the first substrate 10 to thus obtain the light-transmissive member 5. The light-transmissive member 5 is cured while in a state of being in contact with the upper surfaces of the light emitting elements 1, the upper surface and the outer surface of the reflective member, and the upper surface of the first substrate 10. The sheet-like light-transmissive member 5 is disposed along the upper surfaces of the light emitting elements 1 and the upper surface of the first substrate 10. Accordingly, the light emitting device 100 includes, on the upper surface of the light-transmissive member 5, a step that causes a difference in height between the upper surface of the first substrate 10 and the upper surfaces of the light emitting elements 1.

The light-transmissive member 5 may be formed in a sheet-like shape or a plate-like shape and disposed on the light emitting element 1 or may be applied by spraying or the like in layers on the light emitting elements 1 and the reflective members 7. Alternatively, it can be formed in a sheet-like shape on the light emitting elements 1 by injection molding, transfer molding, compression molding, or the like by using a mold and the like. The light-transmissive member 5 is disposed in a manner so that the outer edge 51 of the lower surface comes into contact with the upper surface of the first substrate 10. This improves the adhesion to the first substrate 10.

Examples of the light-transmissive member 5 containing the wavelength conversion member include a member containing a phosphor powder in a light-transmissive resin forming the base body. As the base body, a resin similar to the resin used for the base body of the reflective member 7 described above can be used. The thickness of the light-transmissive member 5 can be in a range, for example, from approximately 20 μm to 100 μm. Note that the light-transmissive member 5 is formed with a size allowing it to cover all of the upper surfaces of the plurality of light emitting elements 1 and the reflective members 7 and allowing the outer edge 51 of the lower surface to come into contact with the first substrate 10. Specifically, the size is such that the outer edge of the light-transmissive member 5 is located outward of the outer edge of a reflective member 7 by at least twice the thickness of the light emitting element 1 and such that the outer edge of the light-transmissive member 5 is located outward of the outer edge of the reflective member 7 by at least twice the thickness of the light-transmissive member 5, for example. Also, the light-transmissive member 5 is provided on the first substrate 10 and extends to a position covered by the first protrusion portion 41 described below.

Examples of the phosphor include an yttrium aluminum garnet based phosphor (for example, $Y_3(Al,Ga)_5O_{12}$:Ce), a lutetium aluminum garnet based phosphor (for example, $Lu_3(Al,Ga)_5O_{12}$:Ce), a terbium aluminum garnet based phosphor (for example, $Tb_3(Al,Ga)_5O_{12}$:Ce), a CCA based phosphor (for example, $Ca_{10}(PO_4)_6C_{12}$:Eu), an SAE based phosphor (for example, $Sr_4Al_{14}O_{25}$:Eu), a chlorosilicate based phosphor (for example, $Ca_8MgSi_4O_{16}C_{12}$:Eu), a β-SiALON based phosphor (for example, $(Si,Al)_3(O,N)_4$:Eu), an a based SiAlON phosphor (for example, $Ca(Si,Al)_{12}(O,N)_{16}$:Eu), an SLA based phosphor (for example, $SrLiAl_3N_4$:Eu), a nitride based phosphor such as a CASN based phosphor (for example, $CaAlSiN_3$:Eu) or an SCASN based phosphor (for example, $(Sr,Ca)AlSiN_3$:Eu), a fluoride phosphor such as a KSF based phosphor (for example, $K_2SiF_6$:Mn), a KSAF based phosphor (for example, $K_2(Si,Al)F_6$:Mn) or an MGF based phosphor (for example, $3.5MgO0.5MgF_2GeO_2$:Mn), a phosphor having a perovskite structure (for example, $CsPb(F,Cl,Br,I)_3$), a quantum dot phosphor (for example, CdSe, InP, $AgInS_2$, or $AgInSe_2$), and the like.

The KSAF based phosphor may have a composition represented by Formula (I) below.

$$M_2[Si_pAl_qMn_rF_s] \qquad (I)$$

In Formula (I), M represents an alkali metal and may include at least K. Mn may be a tetravalent Mn ion. p, q, r, and s may satisfy $0.9 \leq p+q+r \leq 1.1$, $0 \leq q \leq 0.1$, $0 \leq r \leq 0.2$, $5.9 \leq s \leq 6.1$. Preferably $0.95 \leq p+q+r \leq 1.05$ or $0.97 \leq p+q+r \leq 1.03$, $0 \leq q \leq 0.03$, $0.002 \leq q \leq 0.02$ or $0.003 \leq q \leq 0.015$, $0.005 \leq r \leq 0.15$, $0.01 \leq r \leq 0.12$ or $0.015 \leq r \leq 0.1$, $5.92 \leq s \leq 6.05$ or $5.95 \leq s \leq 6.025$. Examples thereof include compositions represented by $K_2[Si_{0.946}Al_{0.005}Mn_{0.049}F_{5.995}]$, $K_2[Si_{0.942}Al_{0.008}Mn_{0.050}F_{5.992}]$, $K_2[Si_{0.939}Al_{0.014}Mn_{0.047}F_{5.986}]$. According to such a KSAF based phosphor, a red light emission having a high luminance and a narrow half band width of the light emission peak wavelength can be obtained.

Covering Member

The covering member 40 is a resin with light shielding properties that covers the wires 130 located outward of the element placement region 13. As an example, the covering member 40 is disposed in a frame-like shape in a plan view covering the wires 130 and surrounding the element placement region 13. The covering member 40 is disposed in contact with the first protrusion portion described below.

The covering member 40 disposed in a frame-like shape has a greater width in the region on the long sides of the rectangle of the first substrate 10 with a substantially rectangular shape in a plan view than in the region on the short sides. Furthermore, the covering member 40 is disposed with a height (that is, the distance from the upper surface of the second substrate 20 to the upper surface of the covering member 40) the highest directly above a top portion 130a of the wire 130 (here, the loop top of the wire). In other words, the covering member 40 is disposed with a top portion 40a of the covering member 40 overlapping with the top portion 130a of the wire 130. Note that the position of the top portion 40a of the covering member 40 is positioned above a top portion 41a of the first protrusion portion 41 described later.

Examples of the covering member 40 with light shielding properties include a resin containing a filler having light shielding properties. Examples of the resin forming the base body include a silicone resin, a modified silicone resin, an epoxy resin, a modified epoxy resin, an acrylic resin, and the like. Examples of the filler having light shielding properties include light absorbing substances such as pigment, carbon black, graphite, and the like; light-reflective substances the same as or similar to the light-reflective substances included in the reflective member described above; and the like. Specific examples include white resin having good light reflectivity, black resin having good light absorption, and gray resin having light reflectivity and light absorption. Furthermore, the covering member 40 may include layers of these resin layers.

Of these, taking into consideration the deterioration of resin due to light absorption, a white resin having light reflectivity is preferably used at least on the outermost surface of the covering member 40.

The covering member 40 has light shielding properties and is disposed in contact with the first protrusion portion 41 described below. Because the covering member 40 contains a light-reflective substance and/or light absorbing material as a filler to give it light shielding properties, compared to a case where a light-transmissive resin not containing such filler is used, the amount of resin in the covering member 40 can be reduced. This makes it possible to suppress the load on the wire due to thermal expansion of the resin. Because the effects of heat on the wire are small, the connectivity of the wire can be improved and a light emitting device with good reliability can be achieved.

First Protrusion Portion and Second Protrusion Portion

The light emitting device 100 includes the first protrusion portion 41 disposed along the outer edge of the upper surface of the light-transmissive member 5 and extending over the upper surface of the first substrate 10 and the upper surface of the light-transmissive member 5. The first protrusion portion 41 is disposed in a frame-like shape surrounding the element placement region 13 in a plan view. Specifically, the first protrusion portion 41 is disposed on the first substrate 10 between the element placement region 13 and the first terminals 110 along the outer edge of the upper surface of the light-transmissive member 5, covers the outer edge 51 of the upper surface of the light-transmissive member 5, and is in contact with the upper surface of the first substrate 10. Accordingly, in the light emitting device 100, the adhesion between the light-transmissive member 5 and the first substrate 10 can be improved, and the light emitting device 100 with good reliability can be achieved. In addition, because the upper surface of the first substrate 10 is not exposed in the region surrounded by the first protrusion portion 41 on the upper surface of the light emitting device 100, wiring and the like disposed in the element placement region 13 can be protected from dust and dirt, moisture, external forces, and the like. In this manner, the light emitting device 100 having even better reliability can be achieved.

In the light emitting device 100, the first protrusion portion 41 can be disposed such that the top portion 41a is located upward from the upper surface of the light emitting elements 1. Accordingly, the light emitted from the lateral side from the light emitting elements 1 can be reflected upward, and the light emitting device 100 with great front luminance can be achieved. Furthermore, the top portion 41a of the first protrusion portion 41 is preferably located at a position higher than the top portion of the light-transmissive member 5 located in the element placement region 13. This makes it possible to reflect light emitted to the lateral side via the light-transmissive member 5.

Furthermore, the light emitting device 100 may include the second protrusion portion 42 that comes into contact with the covering member 40 on the upper surface of the second substrate 20. In this case, the second protrusion portion 42 is disposed in a frame-like shape surrounding the first substrate 10, and the covering member 40 is disposed between the first protrusion portion 41 and the second protrusion portion 42 extending from the upper surface of the first substrate 10 across to the upper surface of the second substrate 20. In other words, the covering member 40 is disposed between the first protrusion portion 41 surrounding the element placement region 13 on the first substrate 10 and the second protrusion portion 42 surrounding the substrate placement region 23 on the second substrate 20. The arrangement of the covering member 40 configured as such can be formed by supplying uncured resin for forming the covering member 40 in a frame surrounded by the first protrusion portion 41 and the second protrusion portion 42. In other words, the first protrusion portion 41 and the second protrusion portion 42 can be used as a dam to dam the flow of the uncured resin when the covering member 40 is supplied. For example, the covering member 40 is disposed in contact with the top portion of each of the first protrusion portion 41 and the second protrusion portion 42.

The first protrusion portion 41 and the second protrusion portion 42 can be set to a predetermined height by providing the uncured resin in layers in the height direction. For example, the first protrusion portion 41 and the second protrusion portion 42 are disposed with a predetermined height by disposing one layer of a resin adjusted to a predetermined viscosity from the nozzle on a substrate and repeating the operation.

The first protrusion portion 41 and the second protrusion portion 42 may be light-transmissive to light emitted from the light emitting element 1 and the light-transmissive member 5 or may have light shielding properties. As the material for the first protrusion portion 41 and the second protrusion portion 42, the material used for the covering member 40 described above can be used. Note that the resin for forming the first protrusion portion 41 and the second protrusion portion 42 preferably has higher viscosity than the viscosity of the resin for forming the covering member 40. The viscosity of the resin can be adjusted by, for example, adjusting the amount of a filler for viscosity adjustment contained in the resin.

In a plan view, the first protrusion portion 41 covers the outer edge of the upper surface of the light-transmissive member 5 and is disposed in contact with the upper surface of the light-transmissive member 5 and the upper surface of the first substrate 10. Specifically, the first protrusion portion 41 is disposed in contact with a portion of the upper surface of the light-transmissive member 5 where a portion of the lower surface of the light-transmissive member 5 is in contact with the upper surface of the first substrate 10, and disposed in contact with the upper surface of the first substrate 10. In this manner, the end portion including the outer edge of the light-transmissive member 5 is disposed between the lower surface of the first protrusion portion 41 and the upper surface of the first substrate 10. This suppresses peeling of the light-transmissive member 5 from the first substrate 10 and improves the adhesion between the light-transmissive member 5 and the first substrate 10. In other words, by the light emitting device including the first protrusion portion 41, peeling of the light-transmissive member 5 from the upper surface of the first substrate 10 can be suppressed, and a light emitting device with good reliability can be achieved.

The first protrusion portion 41 does not overlap with the light emitting elements 1 in a plan view so that the light-transmissive member 5 does not block light emitted upward from the light emitting elements 1. Furthermore, the first protrusion portion 41 is preferably disposed in a frame-like shape surrounding the element placement region 13, and the inner edge of the frame is preferably located above the light-transmissive member 5 that comes into contact with the upper surface of the first substrate 10. Also, the first protrusion 41 is preferably separated from the step of the upper surface of the light-transmissive member 5 described above (in other words, the step is preferably not covered). Accordingly, the thickness of the light-transmissive member 5 disposed between the first protrusion portion 41 and the first substrate 10 is constant, and the adhesion between the first protrusion portion 41 and the first substrate 10 is further improved.

Furthermore, the light-transmissive member 5 includes a step between the upper surface of the light-transmissive member 5 disposed in the element placement region 13 and the upper surface of the light-transmissive member 5 covered by the first protrusion portion 41, or in other words, the upper surface of the light-transmissive member 5 includes a region lower than the element placement region 13 along the first protrusion portion 41. Accordingly, spillage from the resin component spilled out from the first protrusion portion 41 formed by resin is less likely to spread to the element placement region 13.

The light emitting device 100 with the configuration described above can be used as a light source of a headlight of a vehicle for example. In the configuration of this case, light is emitted from the light source to the outside via a lens. In the light emitting device 100, the light emitting elements 1 are turned on by an external power supply switch. Note that the light emitting device 100 is configured such that a preset portion or all of the light emitting elements 1 are able to be individually driven.

Method for Manufacturing Light Emitting Device According to First Embodiment

Next, a method for manufacturing a light emitting device will be described with reference to FIGS. 8 and 9A to 9H.

Figure 8:
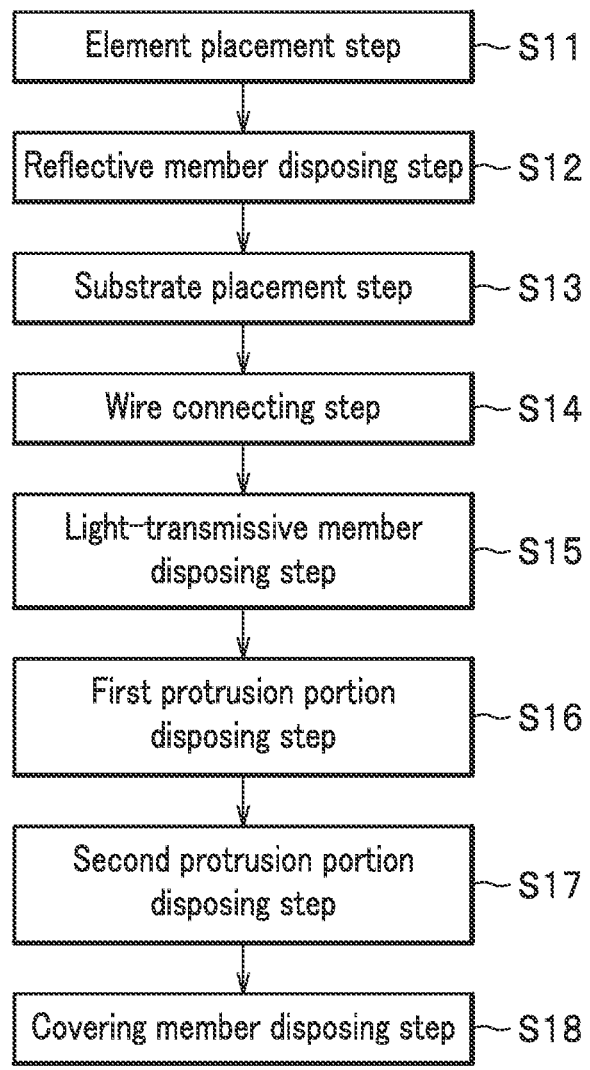
FIG. 8 is a flowchart for describing a method for manufacturing the light emitting device according to the first embodiment.
Figure 9A:
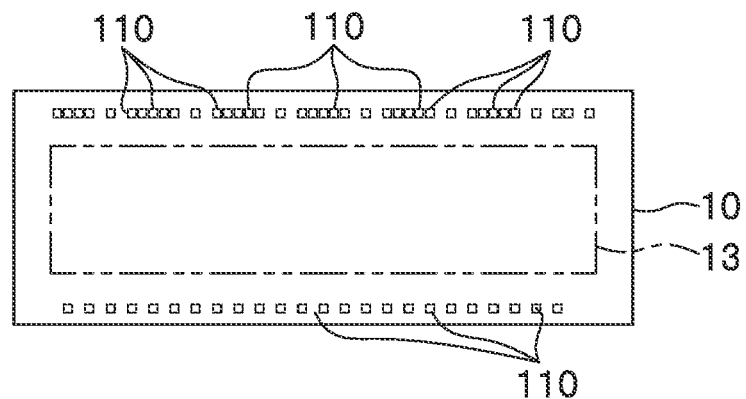
FIG. 9A is a schematic plan view illustrating the method for manufacturing the light emitting device according to the first embodiment.
Figure 9B:
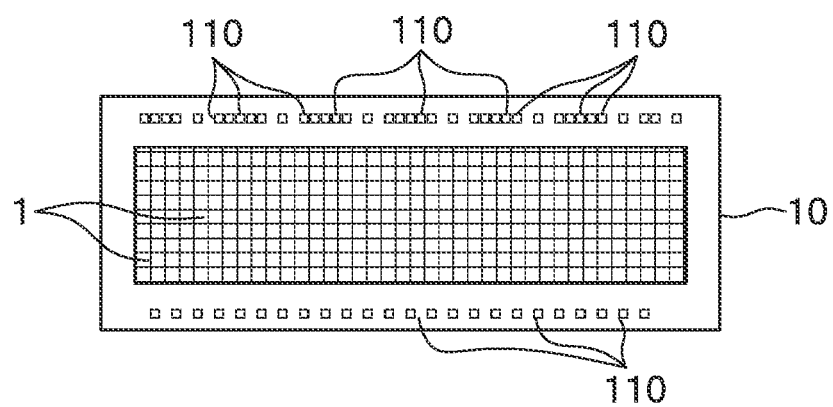
FIG. 9B is a schematic plan view illustrating the method for manufacturing the light emitting device according to the first embodiment.
Figure 9C:
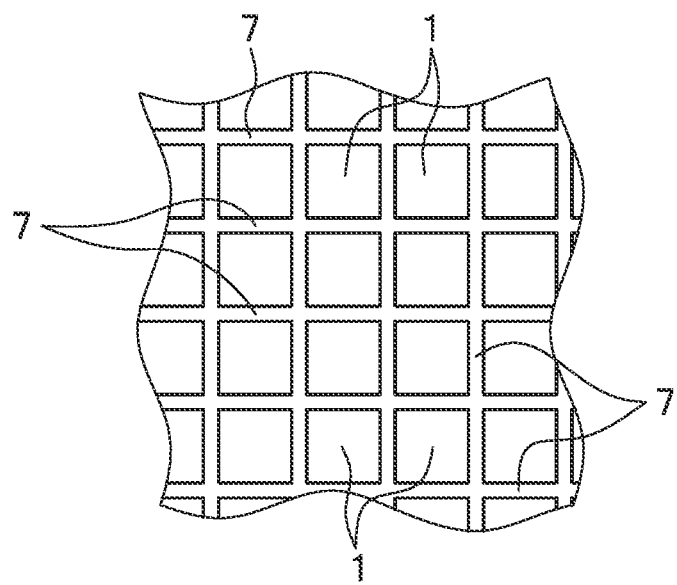
FIG. 9C is an enlarged schematic plan view illustrating the method for manufacturing the light emitting device according to the first embodiment.
Figure 9D:
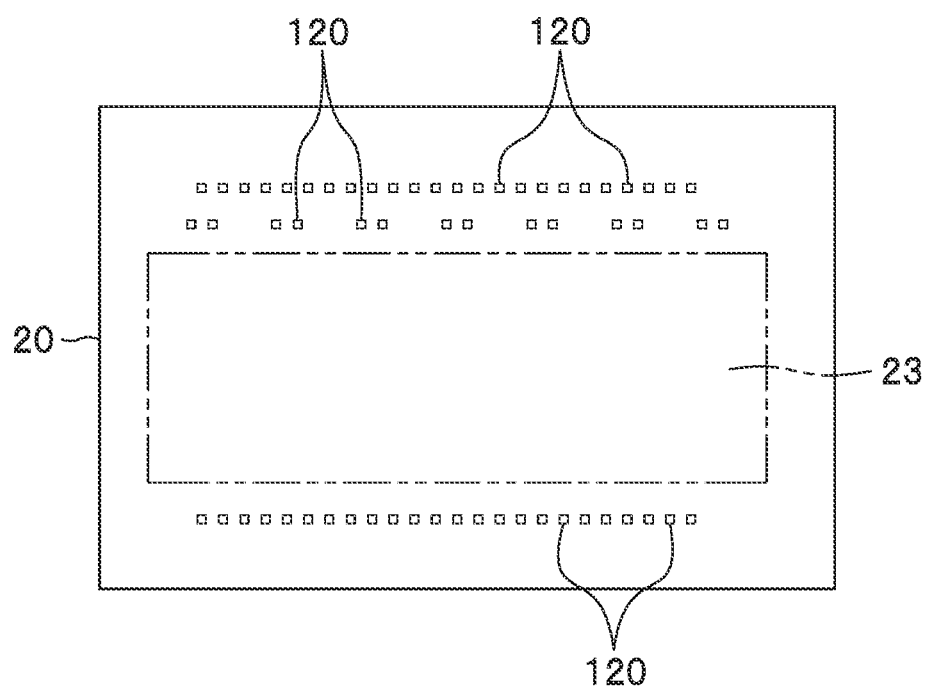
FIG. 9D is a schematic plan view illustrating the method for manufacturing the light emitting device according to the first embodiment.
Figure 9E:
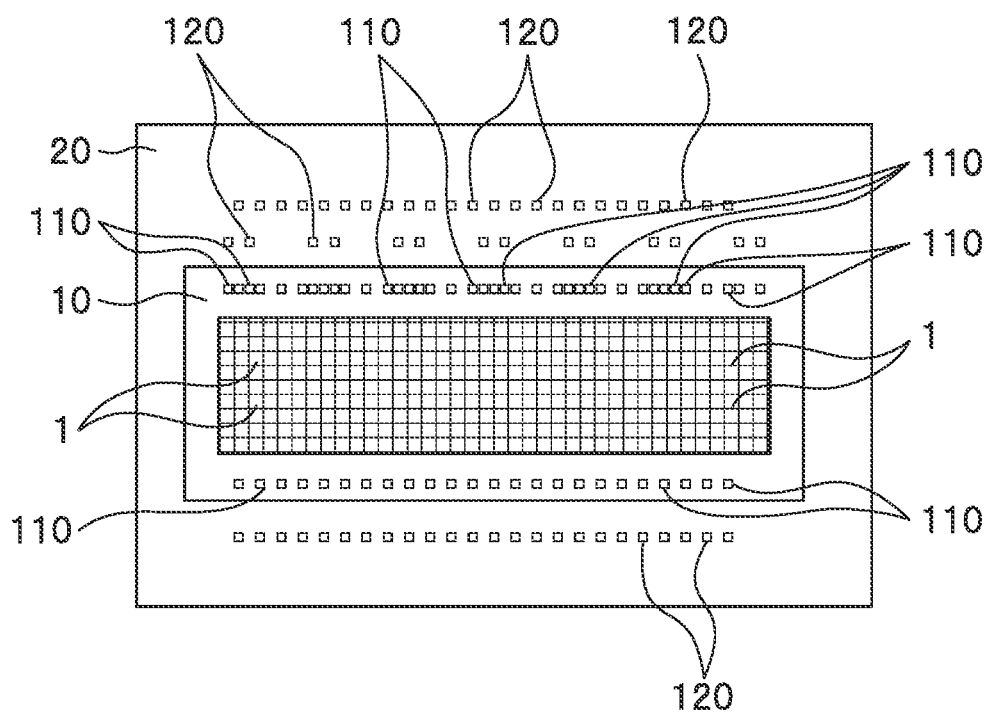
FIG. 9E is a schematic plan view illustrating the method for manufacturing the light emitting device according to the first embodiment.
Figure 9F:
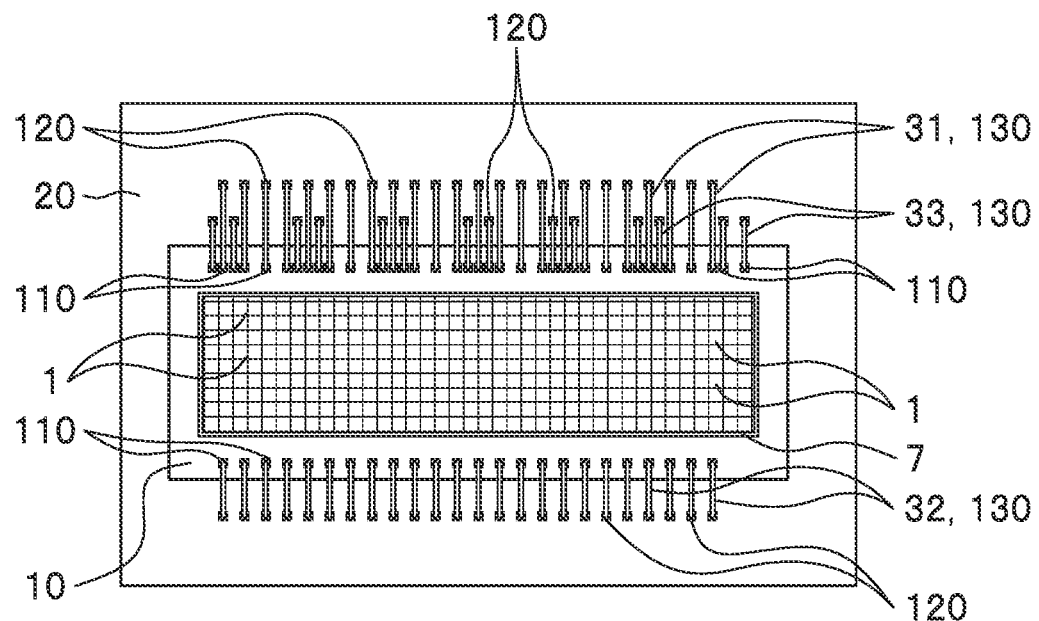
FIG. 9F is a schematic plan view illustrating the method for manufacturing the light emitting device according to the first embodiment.
Figure 9G:
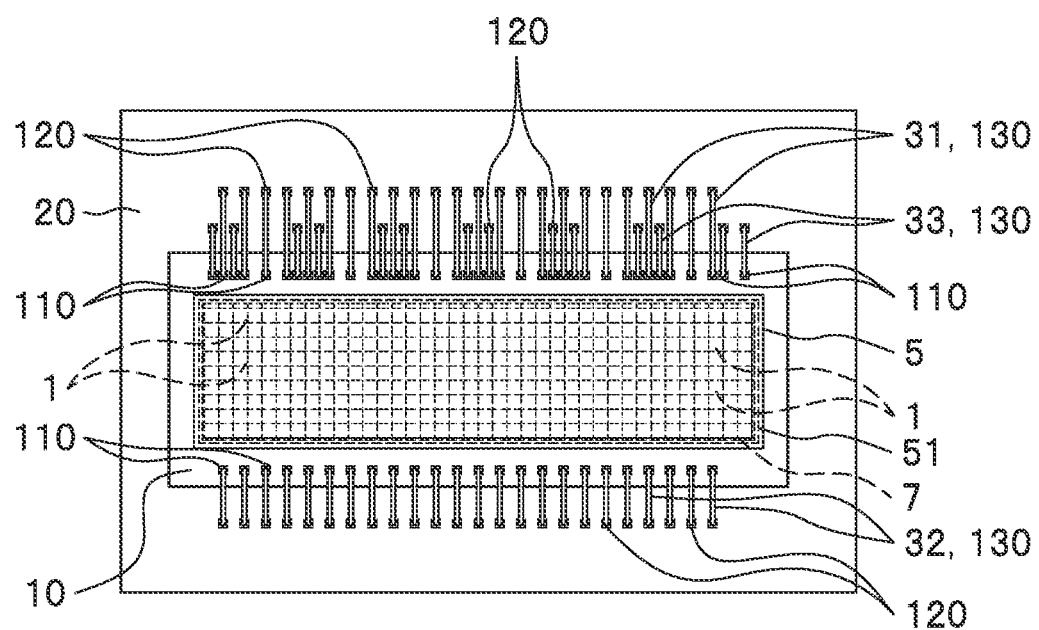
FIG. 9G is a schematic plan view illustrating the method for manufacturing the light emitting device according to the first embodiment.
Figure 9H:
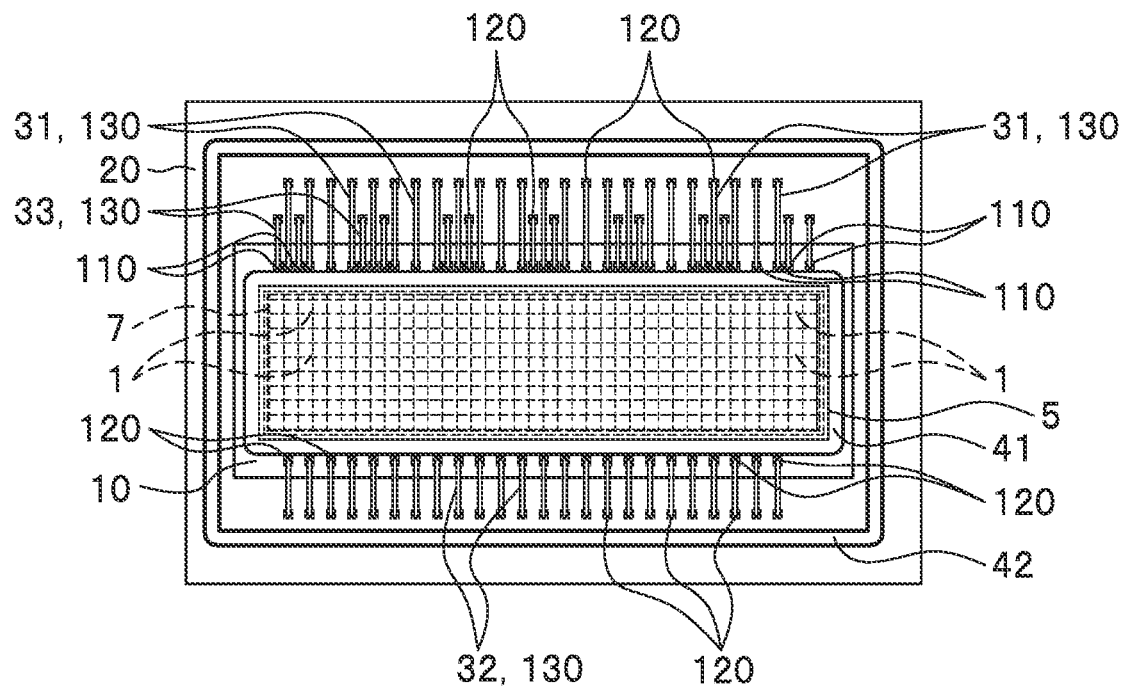
FIG. 9H is a schematic plan view illustrating the method for manufacturing the light emitting device according to the first embodiment.

FIG. 8 is a flowchart for describing a method for manufacturing a light emitting device according to the first embodiment. FIGS. 9A to 9H are schematic plan views illustrating the method for manufacturing the light emitting device according to the first embodiment. Note that, although the light emitting elements 1 are placed at a predetermined interval, the light emitting elements 1 are illustrated with the interval omitted except in the enlarged plan view of FIG. 9C.

A method for manufacturing a light emitting device includes an element placement step S11 of placing a light emitting element in an element placement region of an upper surface of a first substrate; a reflective member disposing step S12 of disposing, on the first substrate, a reflective member that exposes the upper surface of the light emitting element and covers a lateral surface; a light-transmissive member disposing step S15 of disposing a light-transmissive member so that an upper surface of the light emitting element and an upper surface of the reflective member are covered and an outer edge of a lower surface of the light-transmissive member is in contact with the first substrate; and a first protrusion portion disposing step S16 of disposing a first protrusion portion along an outer edge of an upper surface of the light-transmissive member and extending across the upper surface of the first substrate and the outer edge of the upper surface of the light-transmissive member. Furthermore, the method for manufacturing the light emitting device may further include a substrate placement step S13 of placing the first substrate in a substrate placement region of the upper surface of a second substrate; a wire connecting step S14 of connecting a first terminal disposed on the upper surface outward of the element placement region of the first substrate and a second terminal disposed outward of the substrate placement region of the second substrate via wire; a second protrusion portion disposing step S17 of disposing a second protrusion portion outward of the second terminal on the second substrate; and a covering member disposing step S18 of disposing a covering member with light shielding properties and that covers the wire outward of the first protrusion portion and in contact with the first protrusion portion. Note that the first protrusion portion disposing step S16 and the second protrusion portion disposing step S17 may be performed before or after one another or at the same time. Each step will be described below.

The element placement step S11 is a step of placing the plurality of light emitting elements 1 in the element placement region 13 of the first substrate 10. Note that, prior to performing the element placement step S11, it is preferable to prepare the first substrate 10 in which wirings such as the first terminals 110 are disposed in advance.

The light emitting elements 1 can be flip chip mounted in the element placement region 13 on the first substrate 10 via an electrically conductive bond member such as, for example, eutectic solder, a conductive paste, a bump, plating, and the like. The light emitting elements 1 are aligned and placed in rows in the element placement region 13 in a matrix direction with a predetermined interval between the light emitting elements 1. The light emitting elements 1 can be prepared through some or all of the manufacturing processes, such as through a step of semiconductor growth. Alternatively, the light emitting elements 1 may be prepared by purchasing them.

A reflective member disposing step S12 is a step of covering the lateral surfaces of the light emitting elements 1 with a reflective member after the light emitting elements 1 are placed in the element placement region 13 of the first substrate 10. Here, after the light emitting elements 1 are placed on the first substrate 10, white resin, which is an example of the reflective member, is disposed on the lateral surface of the light emitting elements 1 between the light emitting elements 1. The reflective member can be formed by, for example, compression molding, transfer molding, potting, printing, spraying, or the like.

A substrate placement step S13 is a step of placing the first substrate 10 in the substrate placement region 23 of the second substrate 20. Here, the first substrate 10 on which the light emitting elements 1 are placed is disposed in the substrate placement region 23 of the second substrate 20 and, for example, is joined via a bonding material such as a sintered Ag. Note that, prior to performing the substrate placement step S13, it is preferable to prepare the second substrate 20 in which wirings such as the second terminal 120 are disposed in advance.

In a wire connecting step S14, the first terminals 110 of the first substrate 10 and the second terminals 120 of the second substrate 20 are connected with the wires 130.

Preferably, the wires 130 are connected to the second terminals 120 on the second substrate 20 after first being connected to the first terminals 110 on the first substrate 10. By connecting the wires 130 in this order, the top portions of the wires 130 can be positioned closer to the first terminals 110. That is, because the wires 130 can be formed along the step between the first substrate 10 and the second substrate 20, in the covering member disposing step S18 described later, the amount of resin disposed below the wires 130 can be reduced, and breakage of the wires 130 due to thermal expansion of the covering member can be suppressed.

The light-transmissive member disposing step S15 is a step of disposing the light-transmissive member 5 covering the plurality of light emitting elements 1 and the reflective members 7 and with the outer edge of the lower surface in contact with the upper surface of the first substrate 10. In this step, the light-transmissive member 5 that contains a wavelength conversion member is formed in a sheet-like shape with a predetermined size, and is uncured or partially cured, is prepared and disposed on the light emitting elements 1 and the reflective members 7. At this time, the outer edge of the lower surface of the light-transmissive member 5 may be separated from the upper surface of the first substrate 10. The light-transmissive member 5 may be disposed on the light emitting elements 1 via a light-transmissive bond member such as a resin or may be disposed using the tackiness of the light-transmissive member or the like without using a bond member. In this case, a curing step is performed for curing the uncured or partially cured light-transmissive member 5. In the curing step, the light-transmissive member 5 is heated using a heater such as an oven or the like. In the curing step, the uncured or partially cured sheet-like light-transmissive member is softened for the moment by heating, shaped by its own weight along the light emitting elements 1 and the reflective members 7, and cured with the outer edge 51 of the lower surface in contact with the upper surface of the first substrate 10.

The first protrusion portion disposing step S16 is a step of disposing the light-transmissive first protrusion portion 41 across the upper surface of the light-transmissive member 5 and the upper surface of the first substrate 10 between the element placement region 13 and the first terminals 110 on the upper surface of the first substrate 10. In the first protrusion portion disposing step S16, the first protrusion portion 41 is disposed by supplying the uncured resin for forming the first protrusion portion 41 from the nozzle of a dispenser while moving the nozzle along the element placement region 13 on the light-transmissive member 5. Note that regarding the height from the upper surface of the first substrate 10 to the upper surface of the light-transmissive member 5, the height at the upper surface outer edge of the light-transmissive member 5 (in other words, the region in contact with the upper surface of the first substrate) is less than at the upper surface central portion of the light-transmissive member 5 (in other words, the region directly above the light emitting elements 1). The first protrusion portion 41 covers this low region. This can suppress creeping up of the uncured resin forming the first protrusion portion 41 on the upper surface of the light-transmissive member 5 (in other words, the light emitting surface of the light emitting device 100) covering the light emitting elements 1 when the first protrusion portion 41 is supplied.

In the second protrusion portion disposing step S17, the second protrusion portion 42 is disposed on the upper surface of the second substrate 20 outward of the second terminals 120. Note that the same material is preferably used for the first protrusion portion 41 and the second protrusion portion 42, and this allows the first protrusion portion disposing step S16 and the second protrusion portion disposing step S17 to be performed in the same step.

Note that regarding the first protrusion portion disposing step S16 and the second protrusion portion disposing step S17, the second protrusion portion 42 may be disposed first in the second protrusion portion disposing step S17, and then the first protrusion portion 41 may be disposed in the first protrusion portion disposing step S16. Furthermore, the first protrusion portion disposing step S16 may be performed simultaneously with the second protrusion portion disposing step S17, and the first protrusion portion 41 and the second protrusion portion 42 may be disposed at substantially the same time.

The covering member disposing step S18 is a step of bringing the covering member 40 into contact with the first protrusion portion 41 and disposing the covering member 40 with light shielding properties that covers the wires 130 outward of the first protrusion portion 41.

Specifically, this is a step of disposing the covering member 40 with light shielding properties between the first protrusion portion 41 and the second protrusion portion 42. The base material of the first protrusion portion 41 is a resin having a viscosity less than that of the first protrusion portion 41 and the second protrusion portion 42 The covering member 40 is disposed across the first substrate 10 and the second substrate 20. Thus, the covering member 40 also covers the lateral surface of the first substrate 10. Note that the position of the top portion 40a of the covering member 40 disposed in the covering member disposing step S18 is set to be a position higher than the top portion 41a of the first protrusion portion 41. In setting the position of the top portion 40a of the covering member 40 to be higher than the top portion 41a of the first protrusion portion 41, for example, the resin is preferably repeatedly supplied before the supplied resin is cured. The supply of the covering member 40 is preferably performed from directly above the top portion of the wire. Accordingly, the top portion of the wire is easily covered by the covering member 40.

In the first protrusion portion disposing step S16, the second protrusion portion disposing step S17, and the covering member disposing step S18, for example, the first protrusion portion 41 and the second protrusion portion 42 are silicone resins, and the covering member 40 is also a silicone resin. The viscosity of the uncured resin forming the covering member 40 can be adjusted by adding a filler for adjusting the physical properties or viscosity of the resin used in the resin and the like. Furthermore, in these steps, disposing the first protrusion portion 41 and the second protrusion portion 42 also includes disposing uncured or preferably a temporarily cured resin material and is not limited to only a case in which disposing includes completion of full curing.

Second Embodiment

Configuration of Light Emitting Device According to Second Embodiment

Figure 10A:
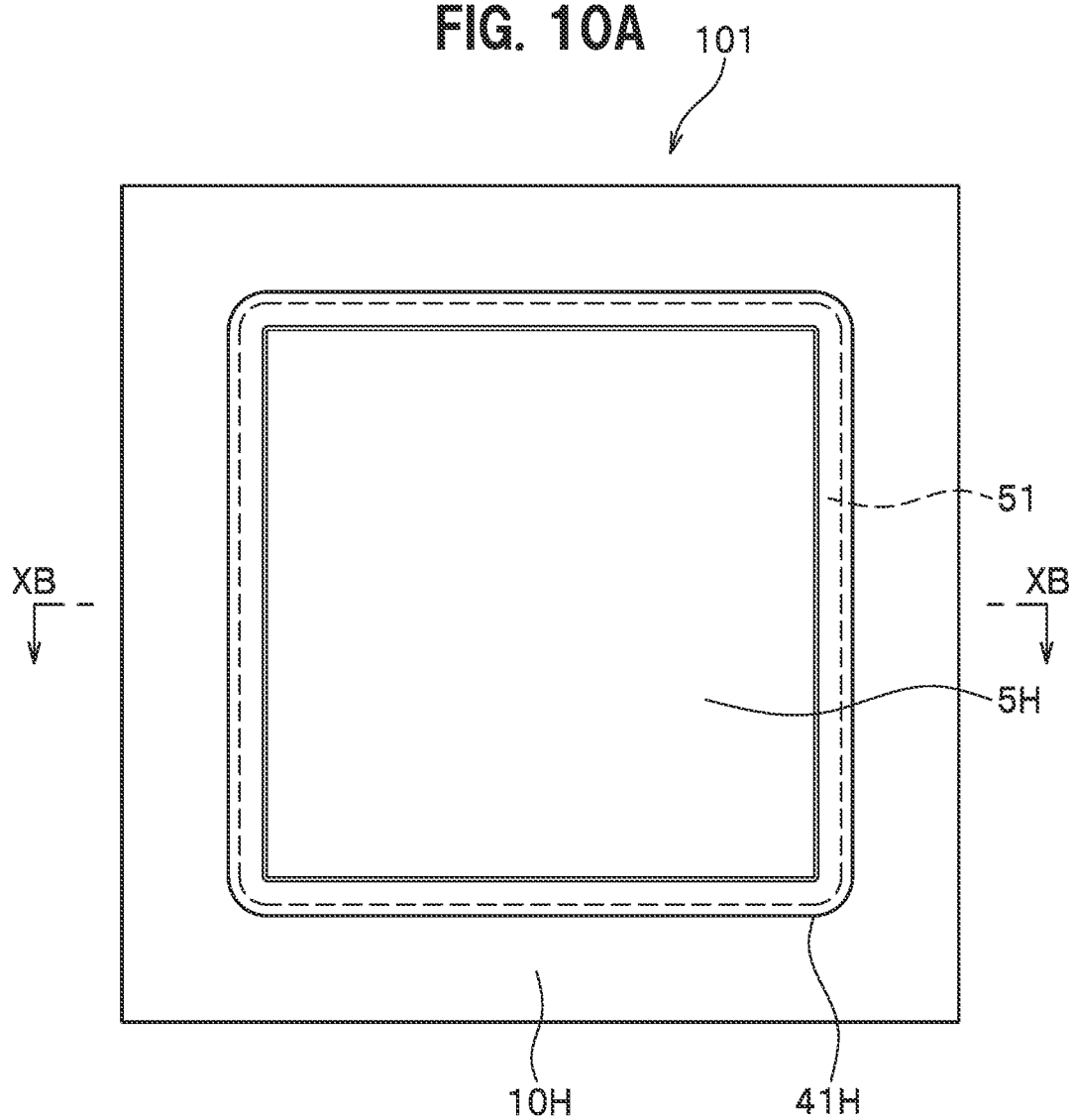
FIG. 10A is a schematic plan view of a light emitting device according to a second embodiment.
Figure 10B:
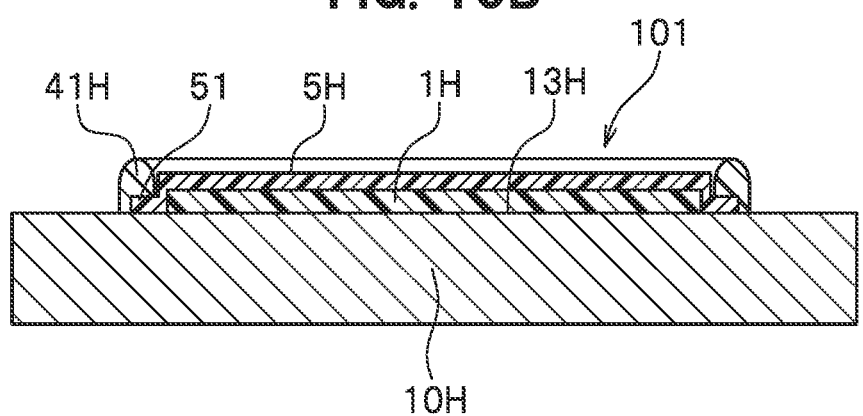
FIG. 10B is a cross-sectional view taken along a line XB-XB in FIG. 10A.
Figure 10C:
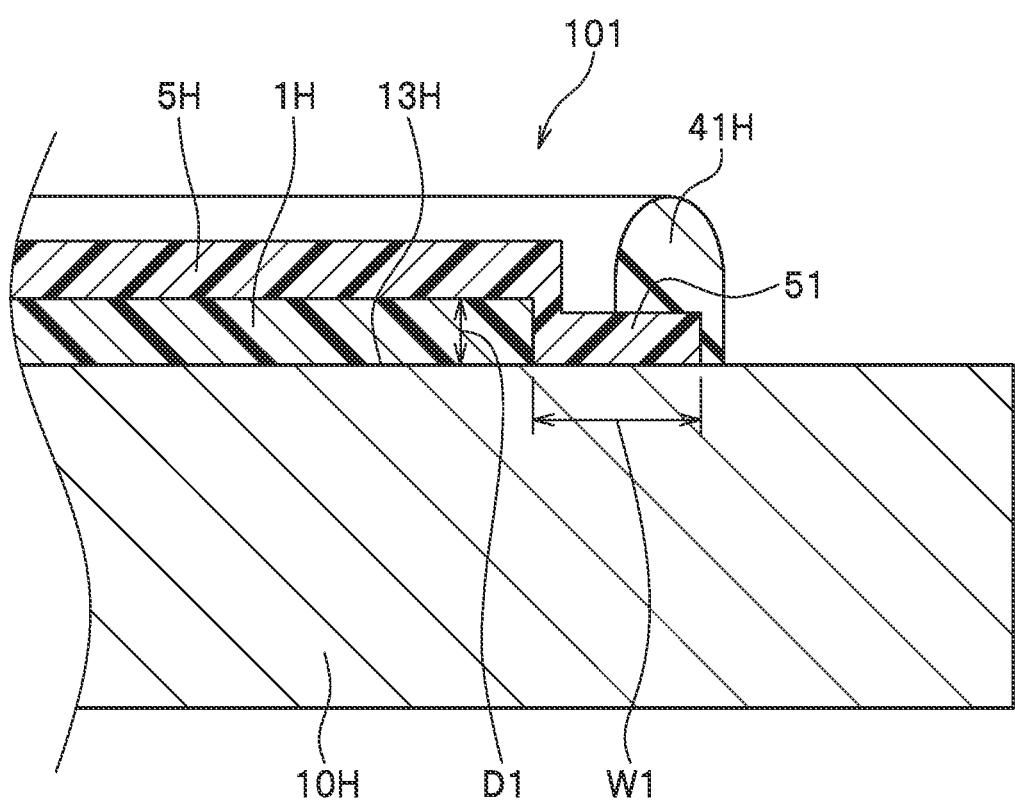
FIG. 10C is an enlarged cross-sectional view illustrating an enlarged portion of FIG. 10B.

Next, a light emitting device according to the second embodiment will be described with reference to FIGS. 10A to 10C. FIG. 10A is a schematic plan view of a light emitting device 101 according to the second embodiment. FIG. 10B is a cross-sectional view taken along a line XB-XB in FIG. 10A. FIG. 10C is an enlarged cross-sectional view illustrating an enlarged portion of FIG. 10B. Note that members with the same configuration described above are denoted by the same reference numerals, followed by an English character "H" applied, and the description thereof will be omitted as appropriate.

The light emitting device 101 includes a light emitting element 1H; a first substrate 10H including an element placement region 13H where, on an upper surface, the light emitting element 1H is placed; a light-transmissive member 5H that covers the light emitting element 1H, the outer edge 51 of the lower surface coming into contact with an outer side of the upper surface of the element placement region 13H of the first substrate 10H; and a first protrusion portion 41H disposed along the outer edge 51 of the upper surface of the light-transmissive member 5H and extending over the upper surface of the first substrate 10H and the upper surface of the light-transmissive member 5H.

The first substrate 10H includes an element placement region 13H on the upper surface, and wirings connected to the light emitting element 1H is disposed in the element placement region 13H. In addition, regarding the first substrate 10H, the second substrate or the wiring for electrically connecting to the outside is disposed at at least one of the lower surface, the lateral surface, or the substrate upper surface outer edge side.

The light-transmissive member 5H extends from the upper surface of the light emitting element 1H to the outer upper surface of the element placement region of the first substrate 10H so that the outer edge 51 of the lower surface comes into contact with the upper surface of the first substrate 10H. As described in the first embodiment, for example, a light-transmissive resin such as a silicone resin can be used for the light-transmissive member 5H. The light-transmissive member 5H may include a wavelength conversion member. In a plan view, the light-transmissive member 5H encapsulates the upper surface of the light emitting element 1H, extends to the upper surface of the first substrate 10H, and is disposed so that the outer edge of the lower surface is in contact with the upper surface of the first substrate 10H. Note that the outer edge 51 of the light-transmissive member 5H is preferably a position separated from the outer edge of the light emitting element 1H by a distance W1 so as to be two or more times a thickness D1 of the light emitting elements 1H.

The first protrusion portion 41H is disposed across the outer edge 51 of the upper surface of the light-transmissive member 5H and the upper surface of the first substrate 10H. For example, as illustrated in FIG. 10B, in a cross-sectional view, the first protrusion portion 41H is preferably disposed so that substantially half of the lower surface of the first protrusion portion 41H covers the outer edge 51 of the upper surface of the light-transmissive member 5H and the other substantially half is in contact with the upper surface of the first substrate 10H. Note that in the light emitting device 101, the light-transmissive member 5H may be disposed in a state where the reflective member is disposed on the lateral surface so as to expose the upper surface of the light emitting element 1H. In a case in which the reflective member is disposed, the light-transmissive member 5H covers the upper surface of the light emitting element 1H and the upper surface and the lateral surface of the reflective member and in contact with the upper surface of the first substrate 10H. The light emitting device 101 is disposed so that the first protrusion portion 41H covers the outer edge 51 of the upper surface of the light-transmissive member 5H, in other words, the end portion of the light-transmissive member 5H is interposed between the first protrusion portion 41H and the first substrate 10H, and thus the adhesion between the light-transmissive member 5H and the first substrate 10H can be improved, and the light emitting device 101 having good reliability can be achieved. Note that the first protrusion portion 41H is preferably disposed at a position separated from the step of the light-transmissive member 5H formed by covering the light emitting element 1H with the light-transmissive member 5H.

In the present embodiment, the light emitting element 1H is described as a single number, however, the present embodiment encompasses a form of a plurality of the light emitting element 1H.

Method for Manufacturing Light Emitting Device According to Second Embodiment

Figure 11:
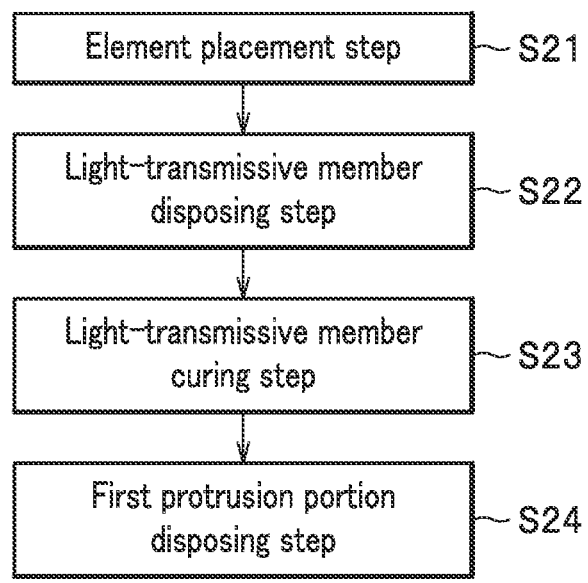
FIG. 11 is a flowchart for describing a method for manufacturing the light emitting device according to the second embodiment.
Figure 12A:
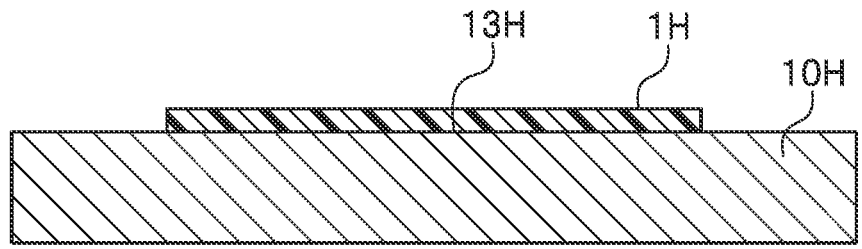
FIG. 12A is a schematic cross-sectional view illustrating the method for manufacturing the light emitting device according to the second embodiment.
Figure 12B:
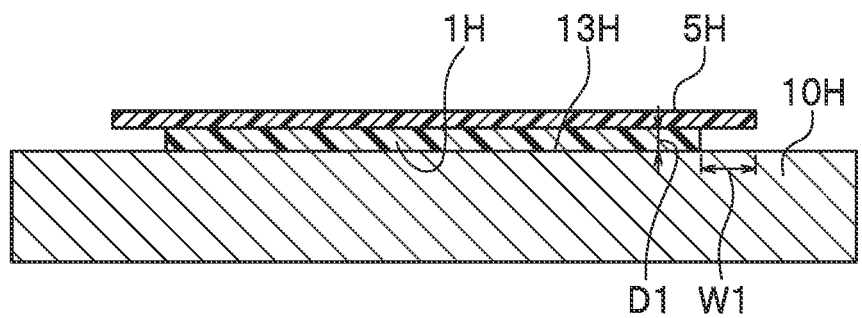
FIG. 12B is a schematic cross-sectional view illustrating the method for manufacturing the light emitting device according to the second embodiment.
Figure 12C:
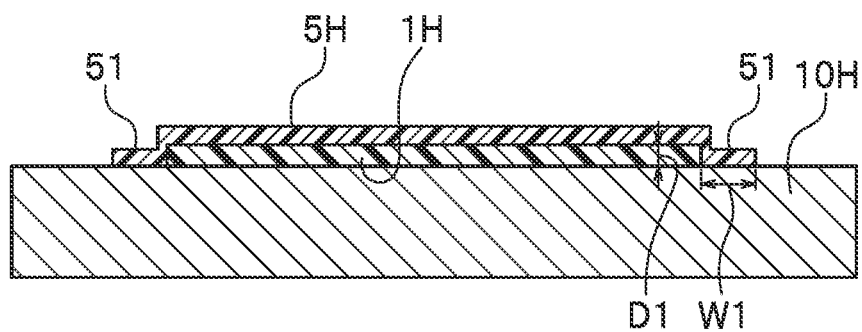
FIG. 12C is a schematic cross-sectional view illustrating the method for manufacturing the light emitting device according to the second embodiment.
Figure 12D:
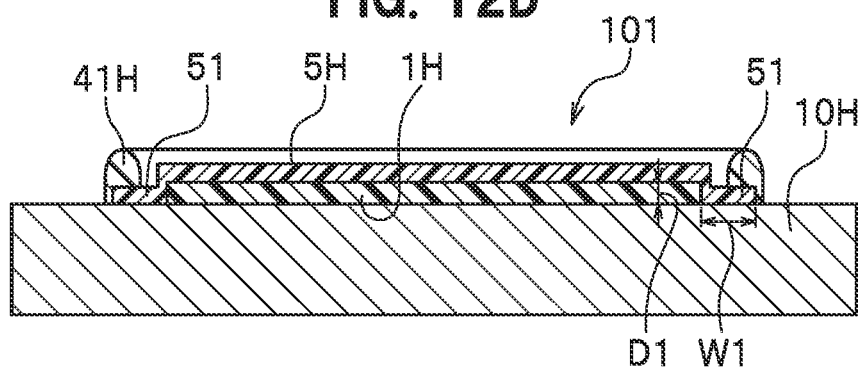
FIG. 12D is a schematic cross-sectional view illustrating the method for manufacturing the light emitting device according to the second embodiment.

Next, a method for manufacturing the light emitting device 101 will be described with reference to FIGS. 11 and 12A to 12D. FIG. 11 is a flowchart for describing a method for manufacturing a light emitting device according to the second embodiment. FIGS. 12A to 12D are schematic cross-sectional views illustrating the method for manufacturing the light emitting device according to the second embodiment.

The method for manufacturing the light emitting device 101 includes an element placement step S21, a light-transmissive member disposing step S22, a light-transmissive member curing step S23, and a first protrusion portion disposing step S24. Note that in the method for manufacturing the light emitting device 101, a reflective member disposing step may be performed between the element placement step S21 and the light-transmissive member disposing step S22.

The element placement step S21 is a step of placing the light emitting elements 1H in the element placement region 13H of the first substrate 10H. The light emitting elements 1H can be flip chip mounted in the element placement region 13H on the first substrate 10H via an electrically conductive bond member such as, for example, eutectic solder, a conductive paste, a bump, plating, and the like.

The light-transmissive member disposing step S22 is a step of disposing the light-transmissive member 5H covering the upper surface of the light emitting element 1H. For the light-transmissive member 5H, for example, a resin containing a wavelength conversion member formed into a sheet-like shape may be used. Specifically, the uncured light-transmissive member 5H formed into a sheet-like shape having a predetermined size is prepared and is disposed on the light emitting element 1H. The light-transmissive member 5H may be fixed on the light emitting element 1H via a light-transmissive bond member such as a resin, or may be fixed using the tackiness of the light-transmissive member or the like without using a bond member. In the softening of the subsequent step, the light-transmissive member 5H used may have a size greater than the area of the upper surface of the light emitting element 1H so that the outer edge of the lower surface comes into contact with the upper surface of the first substrate 10H.

For example, in a case in which the light emitting element 1H has a substantially rectangular shape in a plan view, the light-transmissive member 5H preferably has a substantially rectangular sheet-like shape in a plan view and has a size such that, when covering the upper surface of the light emitting element 1H, the outer edge of the light-transmissive member 5H is separated by at least twice the height D1 of the lateral surface of the light emitting element 1H, this being the distance W1 from the outer edge of the light emitting element 1H.

The light-transmissive member curing step S23 is a step of shaping the light-transmissive member 5H disposed on the light emitting element 1H so that the outer edge 51 of the lower surface comes into contact with the first substrate 10H and curing the light-transmissive member 5H. In the light-transmissive member curing step S23, the light-transmissive member 5H is cured by heating. In the light-transmissive member curing step S23, the uncured sheet-like light-transmissive member 5H is softened by heating, shaped along the upper surface and the lateral surface of the light emitting element 1H, and cured with the outer edge 51 of the lower surface of the light-transmissive member 5H in contact with the upper surface of the first substrate 10H.

The first protrusion portion disposing step S24 is a step of disposing the first protrusion portion 41H along the outer edge 51 of the upper surface of the light-transmissive member 5H and extending over the upper surface of the first substrate 10H and the upper surface of the light-transmissive member 5H. In the first protrusion portion disposing step S24, the first protrusion portion 41H is disposed by supplying the uncured resin for forming the first protrusion portion 41H from the nozzle of a dispenser while moving the nozzle along the outer edge 51 of the upper surface of the light-transmissive member 5H. Here, the height of the upper surface of the light-transmissive member 5H (that is, the distance from the upper surface of the first substrate to the upper surface of the light-transmissive member 5H) is less at the outer edge of the upper surface of the light-transmissive member 5H in contact with the first substrate 10H than at the portion where the upper surface of the light-transmissive member 5H is located on the light emitting element 1H. Accordingly, when the first protrusion portion 41H is disposed, an uncured resin that forms the first protrusion portion can be made less prone to creep up the upper surface of the light-transmissive member 5H.

Through each of the steps described above, the light emitting device 101 can be manufactured. Note that the light emitting device 101 may be used by placing the first substrate 10H on the second substrate.

MODIFIED EXAMPLE

Figure 13:
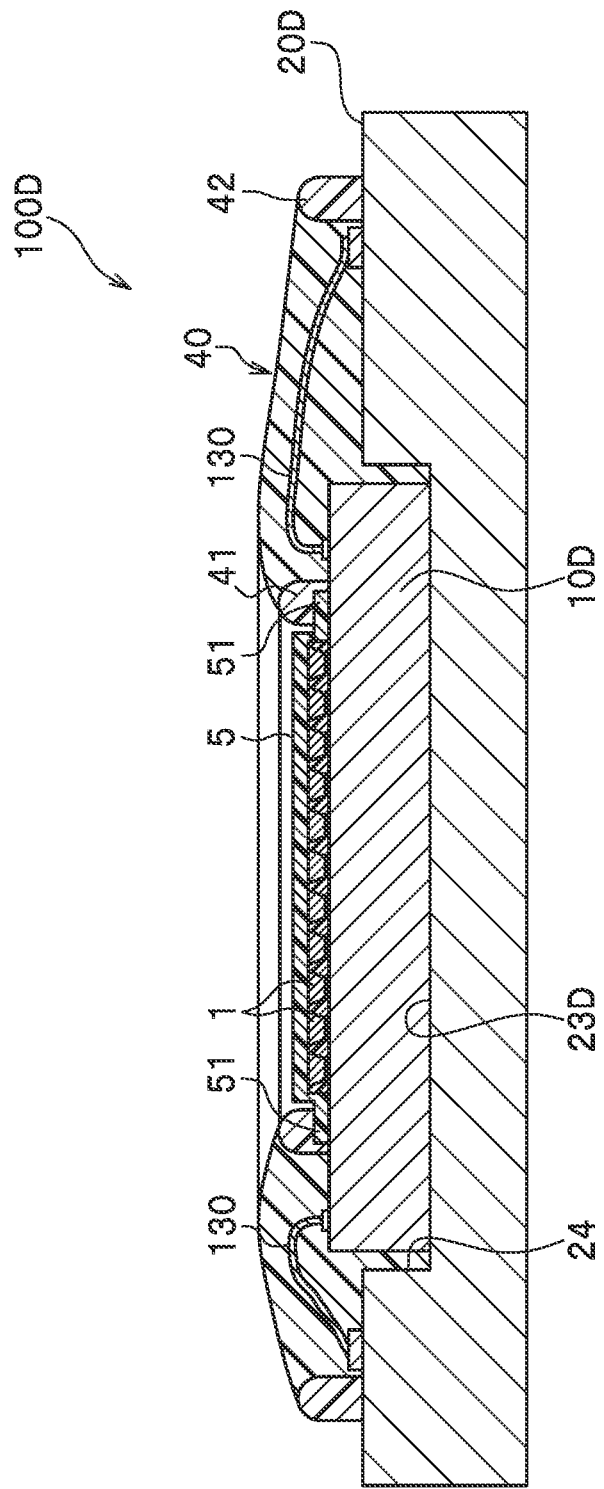
FIG. 13 is a schematic cross-sectional view illustrating a modified example of the first embodiment.

Note that, as illustrated in FIG. 13, a light emitting device 100D may have a recessed portion 24 in the upper surface of a second substrate 20D and may have a substrate placement region 23D in the recessed portion 24. FIG. 13 is a schematic cross-sectional view illustrating a modified example of the first embodiment. The configurations described above are denoted by the same reference numerals. In this manner, by the light emitting device 100D having the recessed portion 24 of the second substrate 20D where the substrate placement region 23D is formed, the overall thickness can be reduced.

Furthermore, in each of the light emitting devices described above, the first protrusion portion may be disposed in parts and arranged in a straight line along the opposing sides of the light-transmissive member, for example. In this case also, the first protrusion portion extends across the outer edge of the upper surface of the light-transmissive member and the upper surface of the first substrate.

Certain embodiments of a light emitting device and a method for manufacturing the light emitting device have been described above, but the present invention is not limited to these embodiments, and should be broadly construed based on the claims. It is to be further noted that aspects of the present invention described with respect to one embodiment may be incorporated in a different embodiment although not specifically described with respect thereto. That is, all embodiments and/or features of any embodiment can be combined in any way and/or combination. In addition, it is needless to say that various modifications, variations, and the like based on this description are also included within the spirit of the present disclosure.

The light emitting devices 100, 100D, 101 according to embodiments of the present disclosure can be used for various light sources such as headlights for vehicles, a projector, lighting, and the like.

The invention claimed is:

1. A light emitting device, comprising:
   a light emitting element;
   a first substrate having an upper surface comprising an element placement region on which the light emitting element is disposed;
   a light-transmissive member with a sheet-like shape that covers the light emitting element, wherein an outer edge of a lower surface of the light-transmissive member contacts an outer side of the upper surface of the element placement region of the first substrate; and
   a first protrusion portion disposed along an outer edge of an upper surface of the light-transmissive member and extending across an upper surface of the first substrate and the upper surface of the light-transmissive member, wherein the first protrusion portion comprises a top portion located higher than an upper surface of the light emitting element.

2. The light emitting device according to claim 1, wherein:
   the first protrusion portion surrounds the element placement region.

3. The light emitting device according to claim 1, wherein:
   the light-transmissive member has a rectangular shape in a plan view; and
   the first protrusion portion is disposed in a rectangular frame-like shape in the plan view.

4. The light emitting device according to claim 1, wherein:
   the light emitting device comprises a plurality of the light emitting elements aligned in rows in the element placement region.

5. The light emitting device according to claim 1, wherein:
   the light emitting device comprises a plurality of the light emitting elements arranged in a matrix pattern forming an overall rectangular shape in the element placement region.

6. The light emitting element according to claim 1, further comprising:
a reflective member that covers a lateral surface of the light emitting element such that the upper surface of the light emitting element is exposed from the reflective member; and
the light-transmissive member covers the light emitting element and the reflective member.

7. The light emitting device according to claim 1, wherein:
the top portion of the first protrusion portion is located at a position higher than a top portion of the light-transmissive member.

8. The light emitting device according to claim 1, wherein:
the first protrusion portion does not overlap with the light emitting element in a plan view.

9. The light emitting device according to claim 1, wherein:
the light-transmissive member contains a phosphor.

10. The light emitting device according to claim 1, wherein:
a thickness of the light-transmissive member is in a range of 20 μm to 100 μm.

11. The light emitting device according to claim 1, further comprising:
a second substrate having an upper surface comprising a substrate placement region on which the first substrate is placed;
a wire that connects a first terminal disposed on an upper surface outward of the element placement region of the first substrate and a second terminal disposed on the upper surface outward of the substrate placement region of the second substrate; and
a covering member that covers the wire, wherein:
the covering member is disposed outward of the first protrusion portion and in contact with the first protrusion portion.

12. The light emitting device according to claim 11, further comprising:
a second protrusion portion disposed on the upper surface of the second substrate and in contact with the covering member, wherein:
the second protrusion portion surrounds the first substrate, and
the covering member is disposed between the first protrusion portion and the second protrusion portion.

13. The light emitting device according to claim 10, wherein:
the covering member comprises a white resin.

* * * * *